United States Patent
Winchell

(10) Patent No.: US 11,091,403 B2
(45) Date of Patent: Aug. 17, 2021

(54) APPARATUS AND METHODS FOR FERTILIZER PRODUCTION

(71) Applicant: Bio-Flex Labs, LLC, Batesville, MS (US)

(72) Inventor: Michael E Winchell, Fairfield Bay, AR (US)

(73) Assignee: Bio-Flex Labs, LLC, Batesville, MS (US)

( * ) Notice: Subject to any disclaimer, the term of this patent is extended or adjusted under 35 U.S.C. 154(b) by 19 days.

(21) Appl. No.: 16/110,782

(22) Filed: Aug. 23, 2018

(65) Prior Publication Data

US 2019/0062231 A1 Feb. 28, 2019

Related U.S. Application Data

(60) Provisional application No. 62/549,821, filed on Aug. 24, 2017.

(51) Int. Cl.
| | |
|---|---|
| *C05C 5/00* | (2006.01) |
| *C01B 21/38* | (2006.01) |
| *H01J 37/32* | (2006.01) |
| *H05H 1/48* | (2006.01) |

(52) U.S. Cl.
CPC ............... *C05C 5/00* (2013.01); *C01B 21/38* (2013.01); *H01J 37/3244* (2013.01); *H01J 37/32532* (2013.01); *H05H 1/48* (2013.01); *H05H 2001/481* (2013.01); *H05H 2001/486* (2013.01)

(58) Field of Classification Search
CPC ... C05C 5/00; H01J 37/3244; H01J 37/32532; H05H 1/48; H05H 2001/481; H05H 2001/486; C01B 21/38
See application file for complete search history.

(56) References Cited

U.S. PATENT DOCUMENTS

| | | | | |
|---|---|---|---|---|
| 3,000,724 | A * | 9/1961 | Langlois | C05B 11/08 |
| | | | | 71/39 |
| 4,141,715 | A * | 2/1979 | Wyse | C05C 11/00 |
| | | | | 204/179 |
| 4,451,436 | A * | 5/1984 | O'Hare | B01J 12/002 |
| | | | | 204/177 |
| 2012/0297673 | A1* | 11/2012 | Keller | B01J 19/088 |
| | | | | 47/57.7 |
| 2014/0127118 | A1* | 5/2014 | Ingels | C01B 21/203 |
| | | | | 423/405 |

FOREIGN PATENT DOCUMENTS

| | | | | |
|---|---|---|---|---|
| GB | | 214413 A * | 4/1924 | ............... H04R 7/04 |
| WO | WO-2016063302 A2 * | | 4/2016 | ............ C05C 11/00 |

* cited by examiner

*Primary Examiner* — Anthony J Zimmer

(57) ABSTRACT

Systems and apparatuses for converting nitrogen gas, such as from ambient air, into fertilizer via interaction with a controlled plasma field using low energy inputs. Mechanisms and methods for cooling splitter apparatuses during production of fertilizer from nitrogen gas. Methods of producing fertilizer from nitrogen gas, such as ambient air, via a splitter creating a plasma output, and for collecting produced fertilizer.

15 Claims, 14 Drawing Sheets

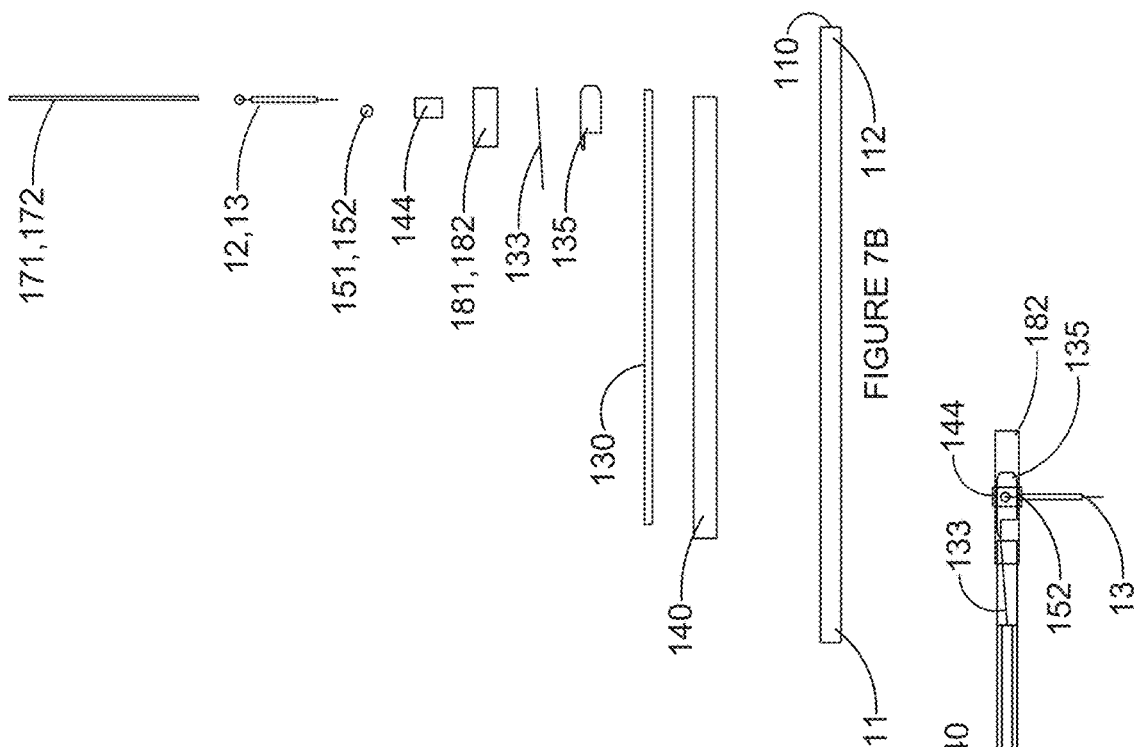
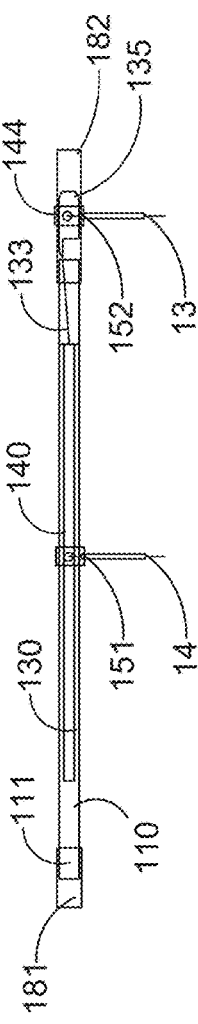
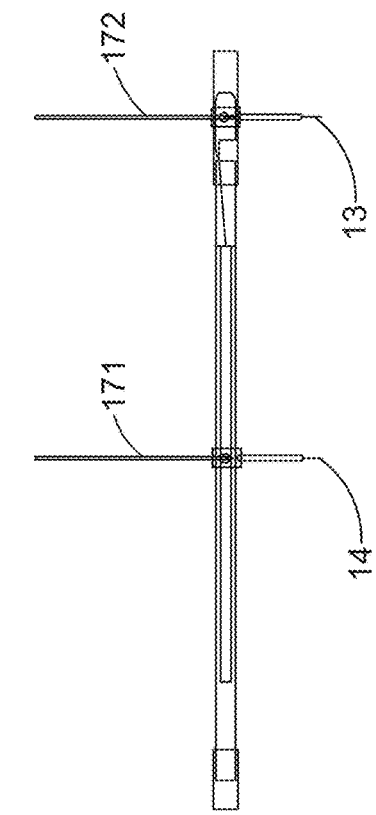
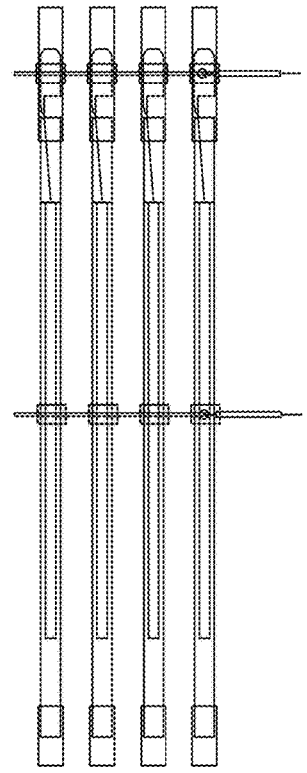

APPARATUS AND METHODS FOR FERTILIZER PRODUCTION

STATEMENT REGARDING FEDERALLY SPONSORED RESEARCH

Not applicable

FIELD OF THE INVENTION

The present invention relates to preparation of fertilizer, and more particularly to preparation of fertilizer from inorganic or organic materials, including ambient air.

BACKGROUND OF THE INVENTION

The Earth's atmosphere comprises 78% nitrogen, 21% oxygen, and trace amounts of water vapor, carbon dioxide, and other gaseous molecules. All living organisms require nitrogen, which is an essential component of biological molecules, such as proteins and nucleic acids. However, organisms cannot use nitrogen in its natural atmospheric form. Atmospheric nitrogen or molecular dinitrogen ($N_2$) is relatively inert. It exists in a triple bonded diatomic form that does not react easily with other chemicals.

The nitrogen cycle is a process in which nitrogen is converted into various biologically useful chemical forms. The conversion of nitrogen can be carried out through both biological and physical processes. Important processes in the nitrogen cycle include fixation, ammonification, nitrification, and denitrification. Nitrogen fixation is the process by which nitrogen in the Earth's atmosphere is converted into ammonia ($NH_3+$). Nitrification is the biological oxidation of ammonia ($NH_3+$) or ammonium ($NH_4+$) to nitrite ($NO_2-$) followed by the oxidation of the nitrite to nitrate ($NO_3-$).

In nature, certain types of bacteria carry out the process of nitrogen fixation, often in symbiotic relationship with plants. As part of the nitrogen cycle, nitrogen fixation is essential for agriculture and for the manufacture of fertilizer. The natural nitrogen cycle is essential to life, but it has proved difficult to commercialize.

There is a need for industrial fixation of nitrogen, primarily to provide ammonia. Ammonia is a required precursor for the manufacture of fertilizers, explosives, and other products. Various methods have been devised for industrial nitrogen fixation. Since 1909 the Haber process of nitrogen fixation has been the leading method of human-produced nitrogen fixation. Although the Haber process is efficient, it requires high pressures and temperatures along with the technological know-how to maintain tight control. There is thus a need for more efficient methods of fixing atmospheric nitrogen and for further converting ammonia into biologically and industrially useful forms.

Plasma is the fourth state of matter, with the other states being gas, solid and liquid. Plasma is an ionized gas consisting of positive ions and free electrons in proportions resulting in more or less no overall electric charge. Plasma state typically occurs at low pressures, such as in the upper atmosphere and in fluorescent lamps. However, the plasma state can also occur at very high temperatures, such as in stars and in nuclear fusion reactors.

Plasma can give rise to two types of discharges, a corona discharge or a plasma discharge. Corona and plasma discharges are created when conditions are right for them to occur in a medium, such as ambient air. The creation of a corona or plasma discharge requires the right amounts of voltage, current and physical properties of the available conductors. Corona discharges are strong enough to break through a dielectric of ambient air to complete a circuit without ionizing air located between the electrodes. Plasma discharges are strong enough to break through a dielectric of ambient air to complete a circuit and completely ionize the air located between the electrodes. Differences between these two types of discharges are used in the invention.

There is a need for apparatuses and methods for fixing nitrogen and preparing other fertilizer components from elemental components having improved energy use and production efficiency.

OBJECTS AND SUMMARY OF THE INVENTION

It is an object of the inventions to provide devices and methods for producing fertilizer.

It is an object of the inventions to provide fertilizer produced from ambient air using low levels of energy input.

Another object of the inventions to provide devices and methods for breaking down molecules using low levels of energy input for various industrial and environmental purposes.

Yet another object of the inventions is to provide devices and methods for producing fertilizer in various settings, such as home, small farm, large farm and industrial.

The foregoing objectives are achieved by providing devices and methods having the features described herein.

The foregoing and other objects, features, aspects and advantages of the invention will become more apparent from the following detailed description of the invention when considered in conjunction with the accompanying drawings.

BRIEF DESCRIPTION OF THE DRAWINGS

FIGS. 7A-7D are views of an alternative embodiment of a splitter.

PREFERRED EMBODIMENTS OF THE INVENTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Overview of the Apparatus

Figure 1:
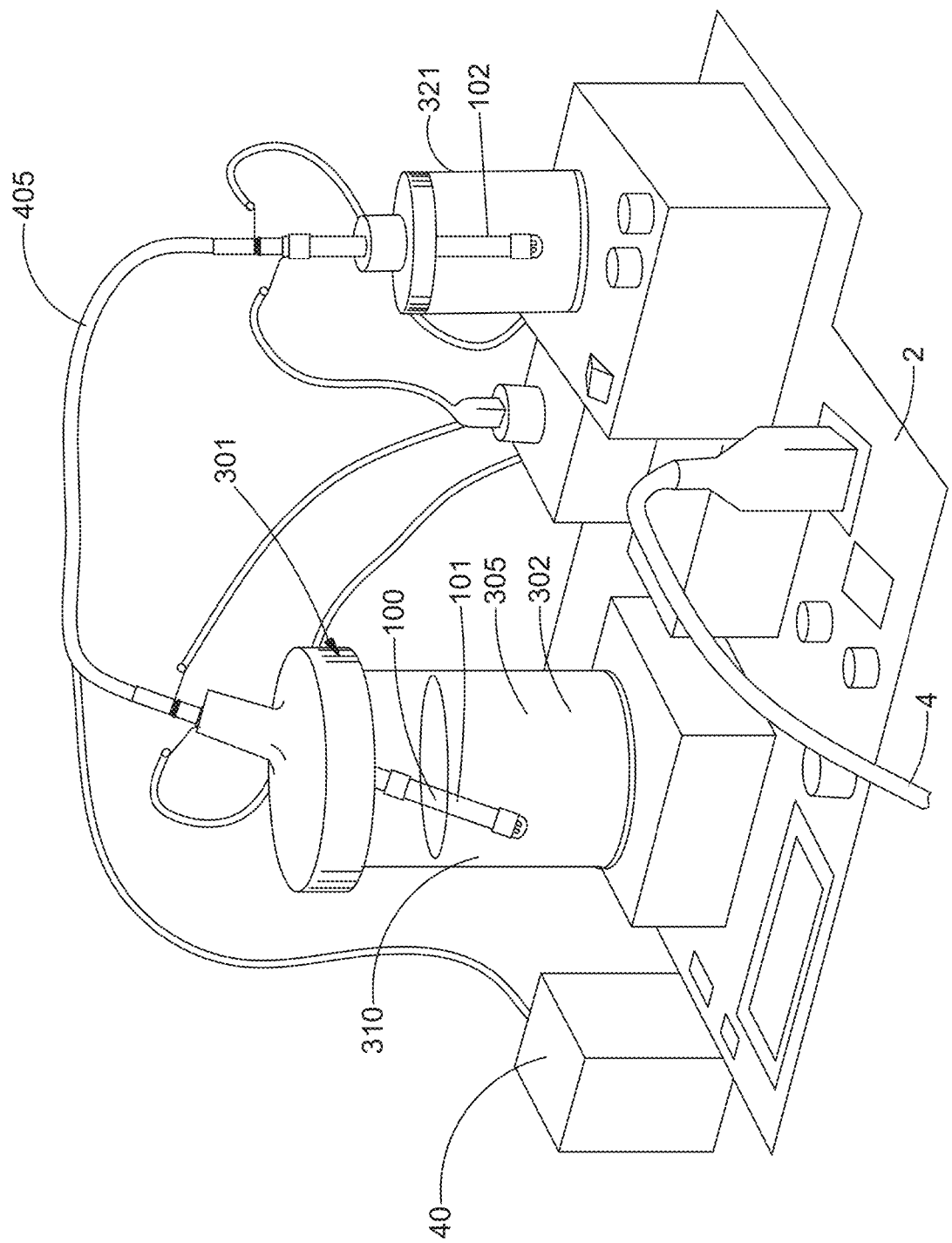
FIG. 1 is a perspective view of one embodiment of a layout of the invention, featuring a primary splitter arrangement and a concentrated splitter arrangement.

As shown in FIG. 1, the apparatus of the invention 1 comprises, generally, a power supply 4, a pump or compressor 40 for pumping gas to a splitter 100, a splitter device 100 for splitting molecules, and at least one collection receptacle or vessel 310 for collecting outputs. As will be described in further detail below, the configuration of the splitter 100 is believed to provide efficiencies in molecular splitting that have not been previously observed. Various methods of efficiently collecting output gases will be described below.

Figure 3:
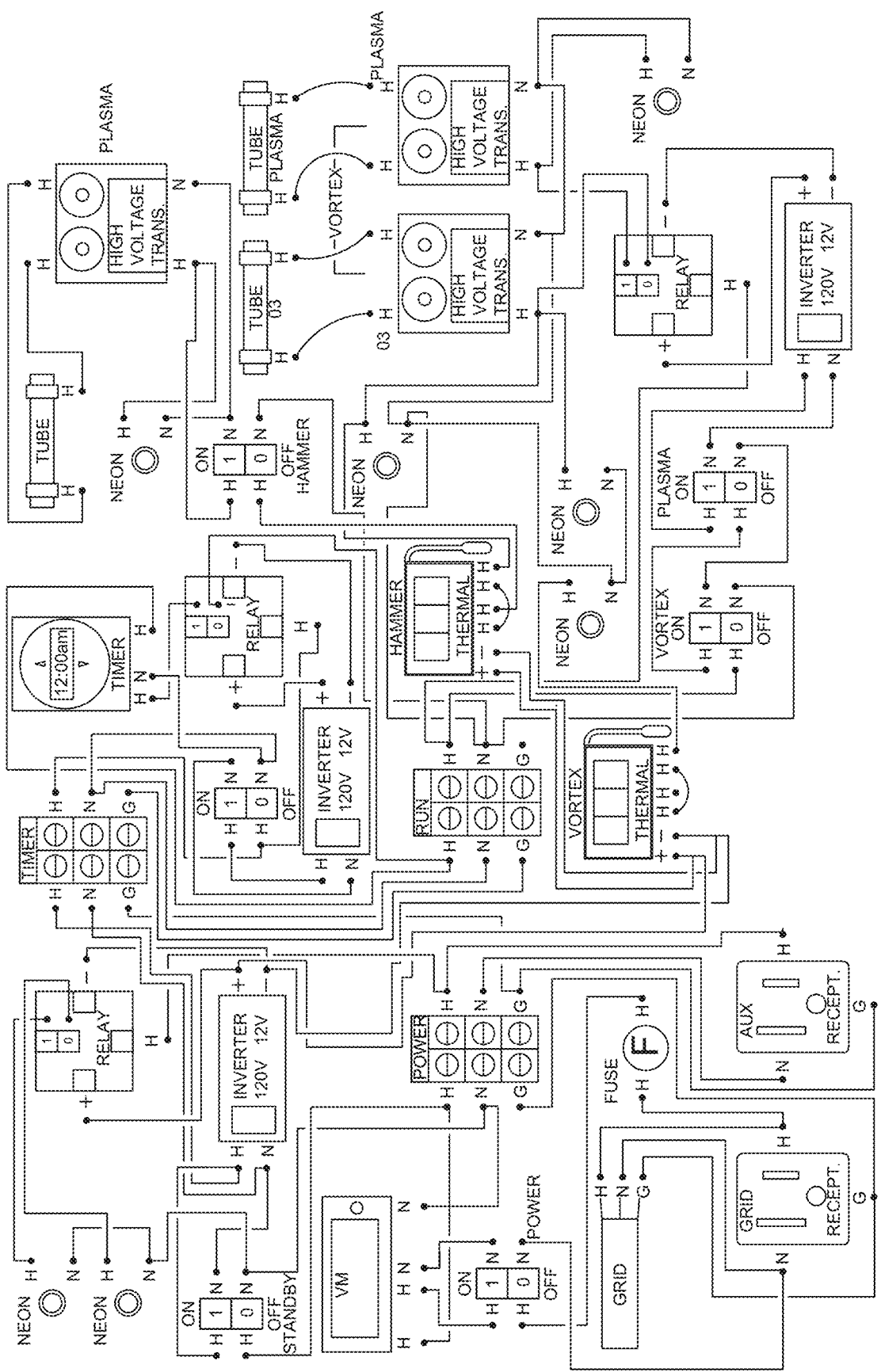
FIG. 3 is a schematic of an arrangement for producing fertilizer.
Figure 6:
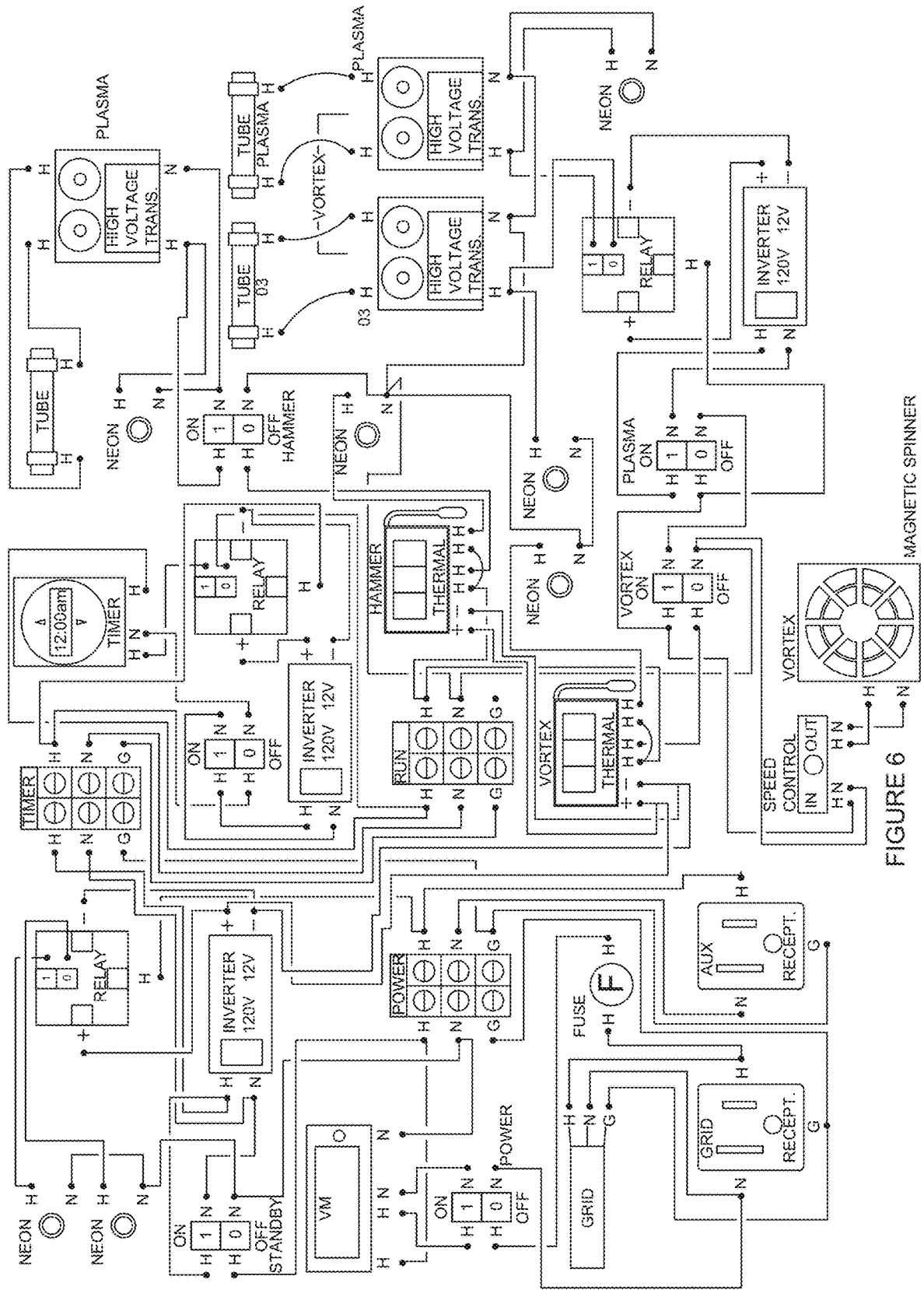
FIG. 6 is a schematic for an arrangement for operating splitters to product ozone.
Figure 8:
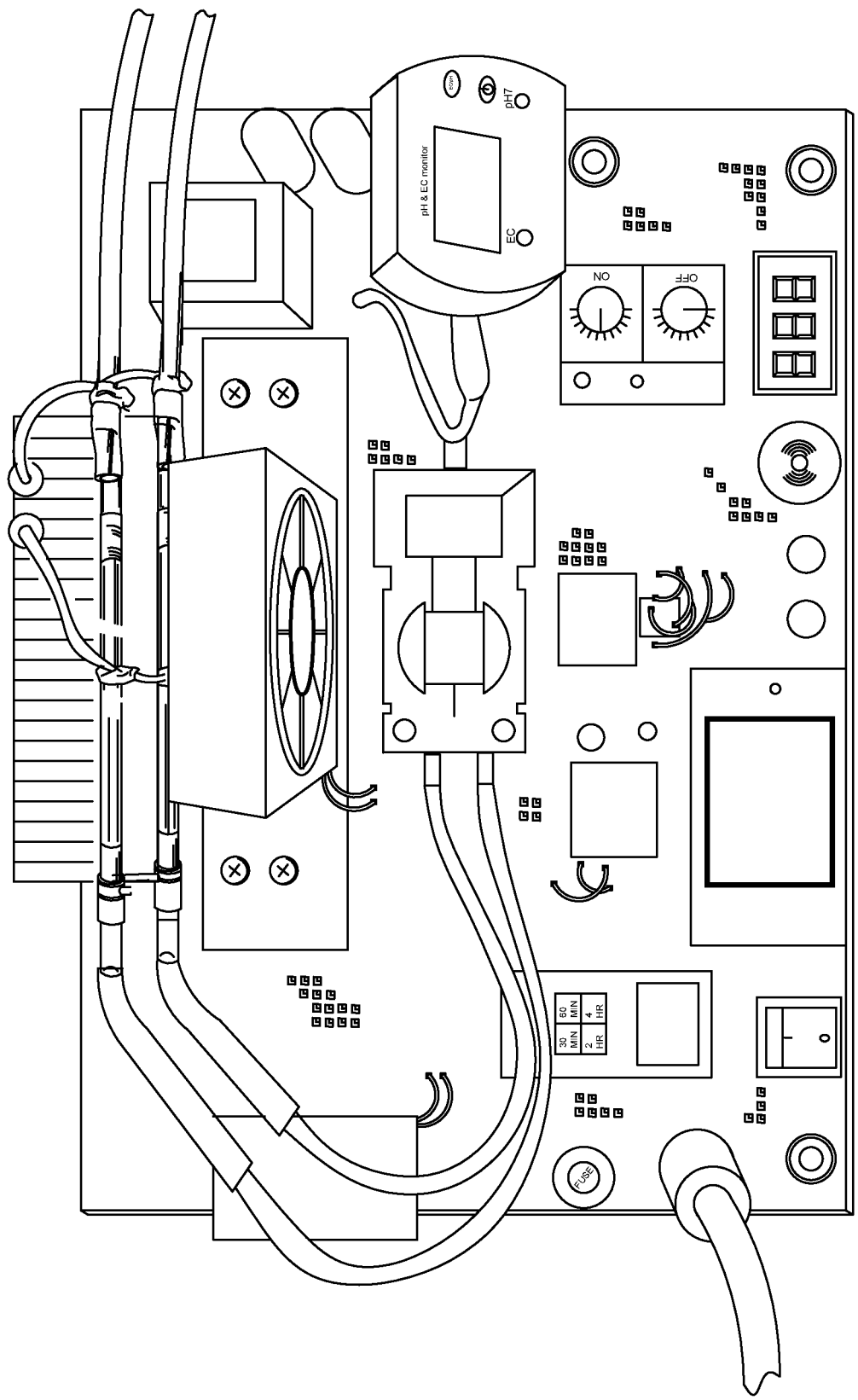
FIG. 8 is a board for operating the splitter of FIG. 7.

As indicated in FIGS. 1, 3 and 6, various other optional features can be provided to enhance the operability of preferred embodiments. These include a circuit board or carrier 2 for supporting the components in a durable, protected, and efficiently spaced arrangement; a power on-off switch for the power supply 4; a cycle timer 10 for cycling power on-off to control temperature build-up in the splitter 100; a timer 20 for timing how long the device has been in operation; a pH display 24 for measuring output pH, as will be described below; a temperature display/thermometer 28 for monitoring temperature; and a voltmeter 32 for tracking energy consumption during operation.

Details of the primary components will now be provided.

Splitter Arrangements

While it is anticipated that splitter arrangements will take various forms without departing from the spirit and scope of the invention, FIG. 1 shows one exemplary arrangement for an apparatus 1 for producing fertilizer according to the invention. In the embodiment of FIG. 1, the fertilizer production apparatus 1 is configured to operate a primary splitter arrangement 301 and a concentrated or "hammer" splitter arrangement 321. The primary and hammer splitter arrangements 301, 321 can be operated simultaneously or individually, depending on production needs. Each of the splitter arrangements 301, 321 includes at least one splitter 101, 102, features of which will be described below.

As shown in FIG. 1, the apparatus 1 features a base or board 2 for supporting the various operational components of the apparatus 1. The operational components serve to selectively provide electrical power and gas to the splitters 101, 102. Operational components include a power supply arrangement 4 (e.g. conventional AC wall current; battery; solar) for delivering electrical charge to the splitters 101, 102, an AC/DC converter, power on-off switches 6, a cycle timer 10, timers 20, pH displays 24, temperature displays 28, voltmeters 32, and a gas pumping arrangement 40 for delivering an input gas 405 to the splitters 101, 102. Some of these components are optional, such as timers and the various displays. Key features of the apparatus 1 are the ability to selectively delivery input gas 405 and electrical charge to the splitters 101, 102, as explained herein.

For many applications, the input gas 405 will be in the form of ambient air. One advantage of the invention 1 is the ability to use ambient air as the input gas 405 and to efficiently (using low energy) and quickly convert atmospheric nitrogen from the ambient air into a usable form of fertilizer. Alternatively, the input gas 405 may be delivered from previously collected sources, such as compression tanks containing nitrogen, carbon dioxide, oxygen and the like. Multiple gas sources may be mixed together to achieve a desired gas mixture for delivery into the splitters 101, 102. If multiple gas sources are used, they can be merged together in a manifold having multiple gas inlet openings and a gas outlet opening. As the output gas 405 is mixed in the manifold, it is expelled from gas outlet opening of the manifold 50 and pumped through tubbing for delivery to the splitter arrangements 301, 321.

The primary difference between a primary splitter arrangement 301 and a hammer splitter arrangement 321 is the amount of water used in the collection vessel. The primary splitter arrangement 301 uses a relatively large collection vessel 302 that contains a relatively large volume of water 305. The exact volume of water in the primary collection vessel 302 will vary depending on the size of the splitter 101, the production goals, and the production speed goals.

The hammer splitter arrangement 321 uses a relatively small collection vessel 322 containing a relatively small volume of water 305. The small volume causes hydrogen ion concentration to rise quickly during operation of the splitter 102, rapidly lowering the pH. The hammer arrangement 321 is particularly efficient at breaking minerals down. The hammer arrangement 321 makes straight nitrogen in large quantities.

Low Energy-Low Heat Splitter

Figure 2:
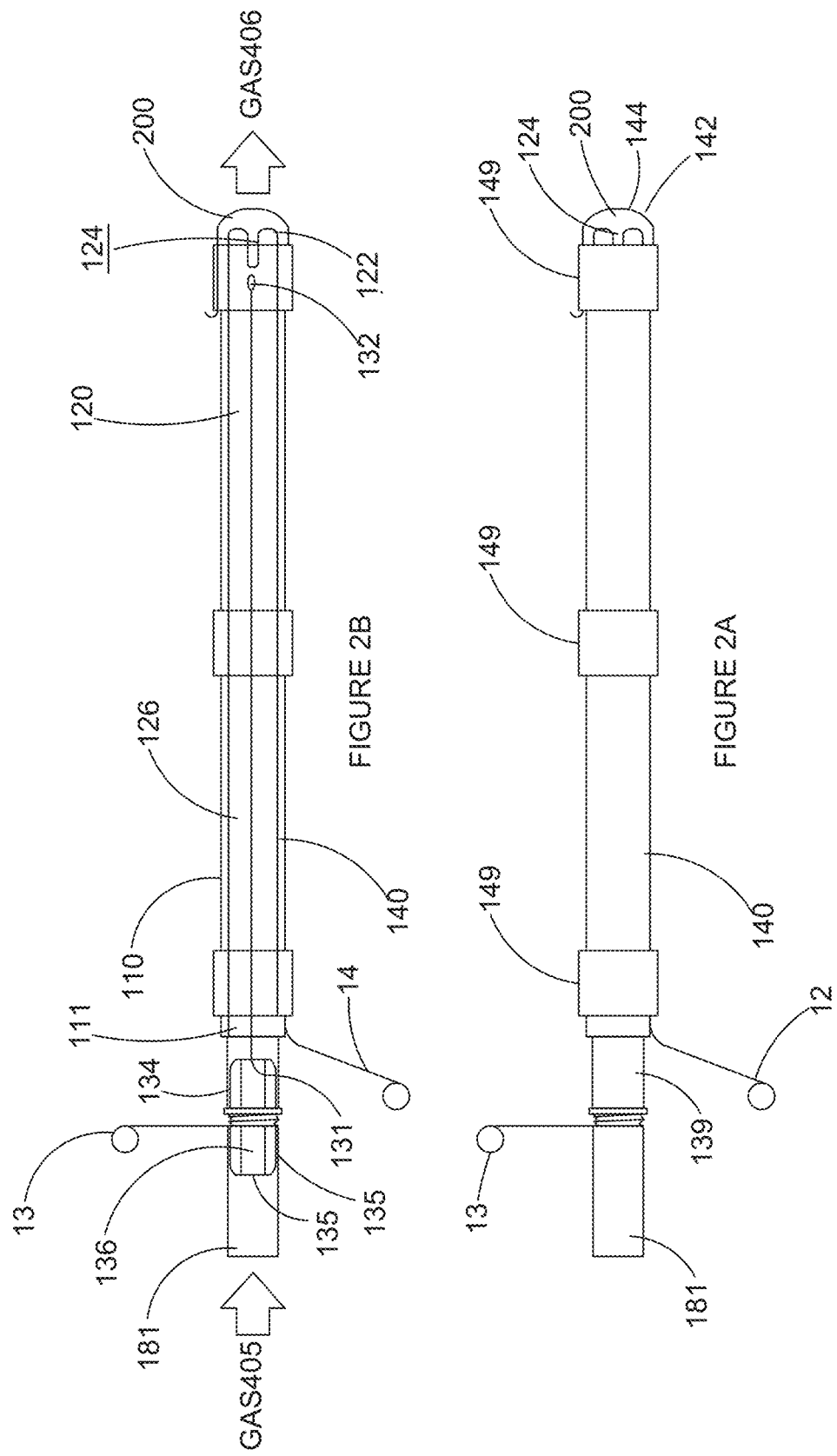
FIG. 2A is a side internal view of one embodiment of a splitter.
FIG. 2B is a side external view of the splinter of FIG. 2A.

Details of embodiments of a splitter 100 will now be described with reference to FIGS. 2A and 2B. FIG. 2A shows an exterior view of one embodiment of a splitter 100. FIG. 2B is similar to FIG. 2A but features interior components of the splitter 100.

As can be seen in FIG. 2B, the splitter 100 comprises, generally, an elongated outer sleeve member 110, an interior sleeve member 120 disposed within the outer sleeve members 110, a first or interior conductor 130 disposed within the interior sleeve member 120, and a second or exterior conductor 140 disposed along an exterior of the splitter 100. Distal ends of the first and second conductors 130, 140 are arranged so as to selectively create a molecular splitter area 200 at the distal end of the splitter 100, as will be described below.

The outer sleeve member 110 is tubular and is made of a high or relatively high dielectric material such as silicon. The outer sleeve 110 has an open input end 111 having an opening 113 therethrough, an open output or discharge end 112 having an opening 114 therethrough, and an interior lengthwise opening 116 extending and communicating between the input and output ends 111, 112. The outer sleeve 110 is elongated. The outer sleeve can have a length of, for examples, 11 to 12 cm. The outer diameter may vary, but may be, for example, 7-9 mm, such as 8 mm. An interior diameter may be, for example 5-7 mm, such as 6 mm.

The interior sleeve member 120 is tubular and is made of a high or relatively high dielectric material, such as glass. The outer sleeve 120 has an open input end 121 having an opening 123 therethrough, an open output or discharge end 122 having a small oriface opening 124 therethrough, and an interior lengthwise opening 126 extending and communicating between the input and output ends 121, 122. The interior sleeve 120 is elongated. The interior sleeve 120 has a length that is about equal to that of the exterior sleeve 110, but may be somewhat longer than the exterior sleeve 110, such as 11 to 13 cm. An outer diameter of the interior sleeve member 120 is configured to fit tightly within an interior diameter of the outer sleeve member 110. An interior diameter of the interior lengthwise opening 126 may be relatively large, such as 2-3 mm, so as to receive the interior filament 130 therein while allowing input gas 405 to flow freely through the interior of the interior tube 120 from the input end 121 to the output end 122. However, the output end 122 of the tube is constricted and opens in a small orifice 124. The orifice 124 provides the output point for the gas 405 to enter the collection vessel 302, 322.

As can be seen in FIG. 2B, a first or interior filament 130 extends through the interior opening 126 of the interior tube 120. The filament 130 has certain characteristics that enhance the functionality of the splitter 100. As can be seen in FIG. 2B, the interior filament 130 has a lengthwise body extending between an input end 131 and an output end 132, essentially in the form of an uninsulated wire.

The input end 131 of the interior filament is electrically connected to a conducting tube member 135 having an interior lengthwise opening 136 therethrough. The conducting tube member 135 is attached to a lead 13, which is preferably integral with the conducting tube member 135, for use in electrically connecting the interior filament 130 to a source of charge. In the embodiment of FIG. 2B, the conducting tube member 135 is provided with a transverse annular ring around an outer circumference thereof. The annular ring is configured for use in coiling the lead 13 around the conducting tube member.

The output end 132 of the interior filament 130 is provided with an enlarged end portion 133, which is electrically conductive. The enlarged end portion 133 is sized to closely fill a distal end of the interior tube 120 adjacent the orifice 124, while allowing input gas 405 to flow around the enlarged end portion 133 and through the orifice 124. The configuration and orientation between the distal end of the interior tube 120, the enlarged end portion 133, and the orifice 124 cause the flow of input gas 405 to exit the orifice 124 under high pressure, which enhances the molecular splitting properties in the molecular splitting area 201.

As can be seen in FIG. 2B, the second or exterior filament 140 extends along an exterior of the splitter 100, such as along an outer surface of the outer sleeve 110. The exterior filament 140 has a lengthwise body extending between an input end 141 and an output end 142, essentially in the form of an uninsulated wire. The input end 141 is attached to a lead 14 for use in electrically connecting the exterior filament 140 to a source of charge. A plurality of bands 149 or other securing means can be used to secure the exterior filament 140 to the outer sleeve 110.

As can be seen in FIG. 2B, an output end 142 of the exterior filament curves or extends around the output end of the outer sleeve 110 to provide a bridge portion 144. This configuration forms a discharge gap 200 between the bridge portion 144 of the exterior filament 140 and the enlarged end portion 133 of the interior filament 130. As can be seen in FIG. 2B, the orifice 124 of the output end 122 of the interior tubular member 120 is positioned within the discharge gap 200. The discharge gap 200 provides what can be referred to as a molecular splitting area 201.

The interaction of the foregoing components to create a plasma discharge will now be discussed. One of the fundamental principles of the apparatus 1 of the invention is that it creates a controlled plasma state and uses the controlled plasma state to efficiently split molecules into constituent ions consisting of individual elements and smaller molecules. This controlled plasma state is created in the molecular splitting area 201. When a charge is applied to the interior and exterior filaments 130, 140, the dielectric properties of the outer sleeve member 110 and the interior sleeve member 120 serve to create a recurring plasma discharge in the discharge gap 200. During operation, an area of purple glow is seen in the molecular splitting area 201, providing a visual sign of the active plasma state. During use, the interior filament 130 is configured to operate at a selected nanofrequency range. For fertilizer production, the interior filament 130 is configured to produce wavelengths of about 200-400 nanometers, which is in the ultraviolet range.

At the same time, the configuration of the enlarged distal end 133 of the interior filament 130, the output end of the interior tube 120, and the orifice 124 of the interior tube 120, create an area of high pressure discharge of input gas 405 into the molecular splitting area 201. It is believed that this combination of high pressure and plasma discharge creates a condition in which gas molecules are readily split into ions in the molecular splitting area.

A combination of dielectric material, voltage, current, and gas flow under high pressure serve to create a unique plasma discharge area that is ideal for splitting molecules and creating fertilizer. The individual ions that are created in the molecular splitting area 201, which can be referred to generally as the output gas 406, migrate into the surrounding liquid 410, 420 in the collection vessel 321, 322, where the ions recombine into nitrogen compounds and other components of fertilizer.

The amount of energy that is required to power the splitting is far lower than is required under conventional industrial nitrogen splitting processes, such as the Haber process. Additionally, temperature buildups in the splitters 100 are remarkably low, particularly when the output end is submerged in a liquid medium. Earlier versions of splitters required fans or other cooling mechanisms to prevent the splitter from overheating. When operating at room temperature, the arrangement shown in FIGS. 1-2 does not require a cooling mechanism. Ideally, the components should be configured to operate at higher temperatures, such as 60-70 degrees C.

Removable Splitter Tips

The high level of activity that occurs in the splitting area can wear out the output end 122 of the interior tube 120 more quickly than the rest of the apparatus. To solve this problem, the output end 122 can be configured as a removal tip. A plurality of removal tips can be provided. To further reduce wear, a glass tube can be fitted over the bridge portion 144 of the exterior filament 140.

Reactor Splitters

Figure 10:
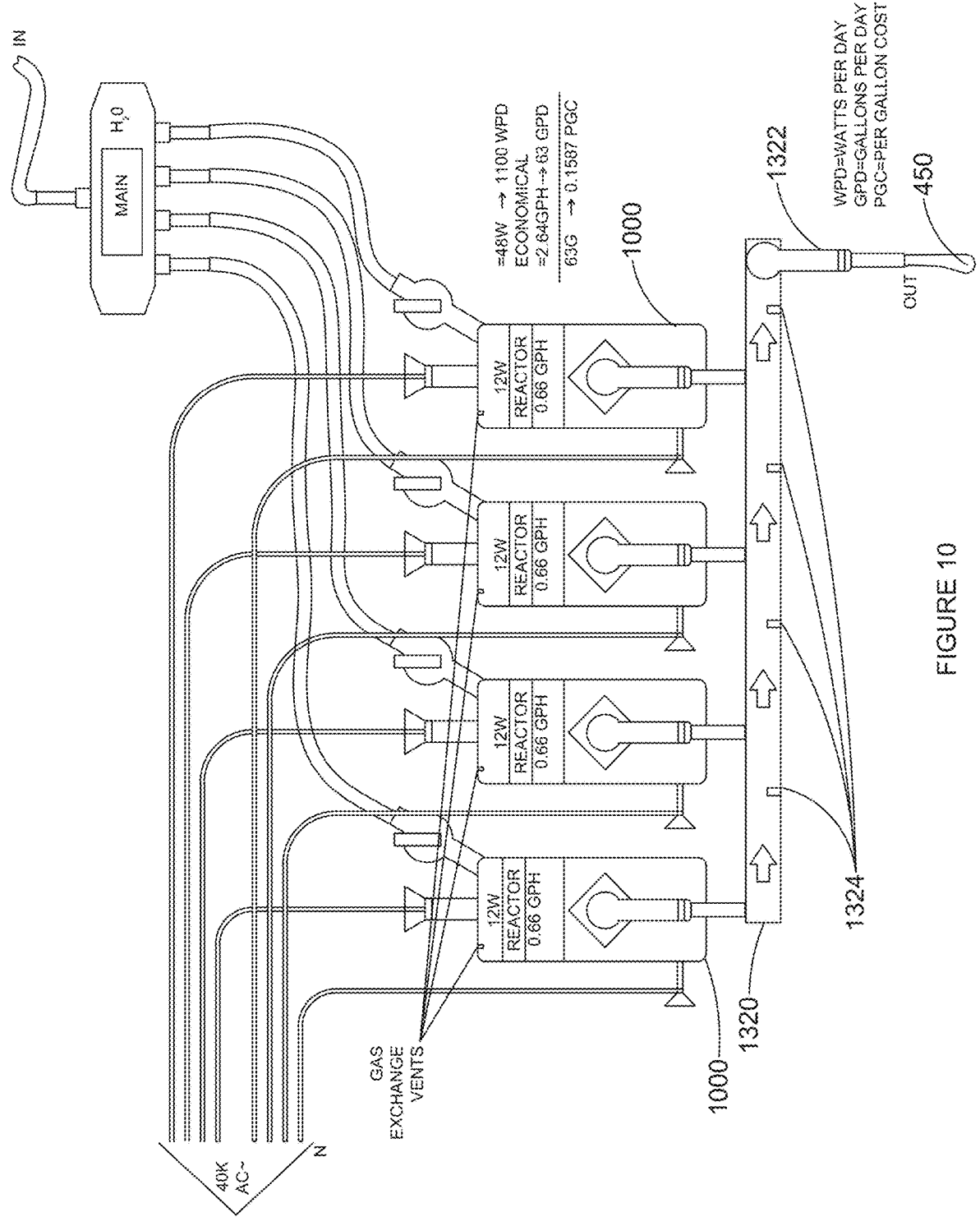
FIG. 10 is a system view of one embodiment of the invention featuring a series of splitter reactors aligned in series to produce fertilizer output to a mineral trap.

Further research led the inventor to develop reactor splitters 1000 of the type shown in FIGS. 10 and 11. The reactor splitter 1000 shares characteristics of the foregoing splitter 100, but is configured to withstand extremely high temperature operating conditions without overheating, to produce large amounts of fertilizer output, and to be constructed of commercially available and economically feasible materials.

FIG. 10 shows a series of reactor splitters 1000. Details about the individual reactor splitters 1000 are described below. Output from the individual reactor splitters 1000 is diverted into a collection vessel 1320, which is depicted as a rail or trough in FIG. 10 but can take various forms, as described below. The collection vessel 1320 will typically include one or more mineral traps 1324, as described below. The mineral trap 1320 can have various configurations, as described below. An outlet 1322, which may be an on-off spigot, allows end product fertilizer 450 to be released from the system for use.

With reference to FIGS. 11A-11D, details of an exemplary reactor splitter 1000 will now be described. A reactor splitter 1000 can be used individually or as part of a production system of the type shown in FIG. 10, depending on the needs of the user.

Figure 11A:
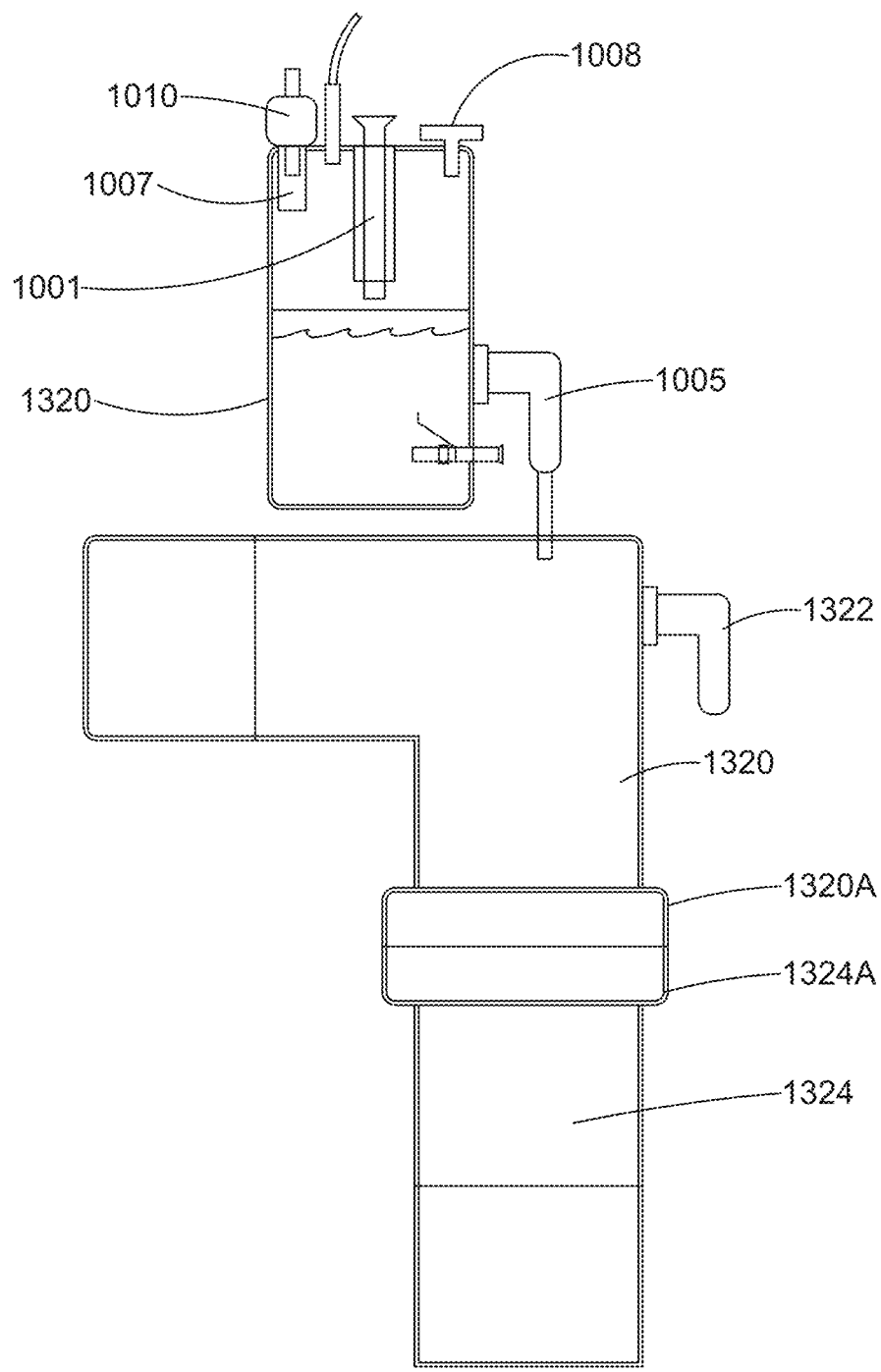
FIG. 11A is a side-view of a splitter reactor suitable for use in a stand-alone arrangement or in series of reactors.
Figure 11B:
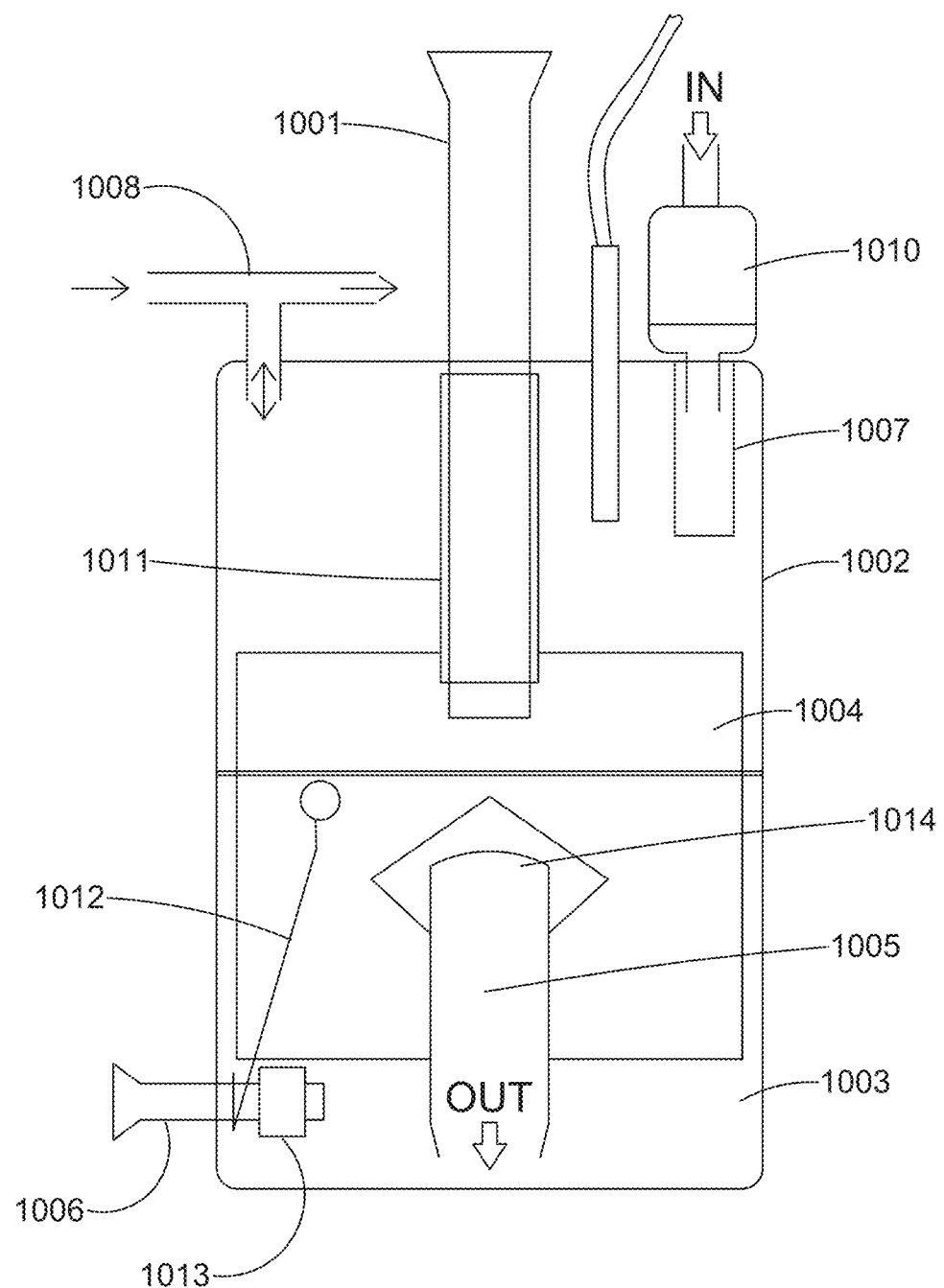
FIG. 11B is a side cross-section view of details of a splitter reactor.
Figure 11C:
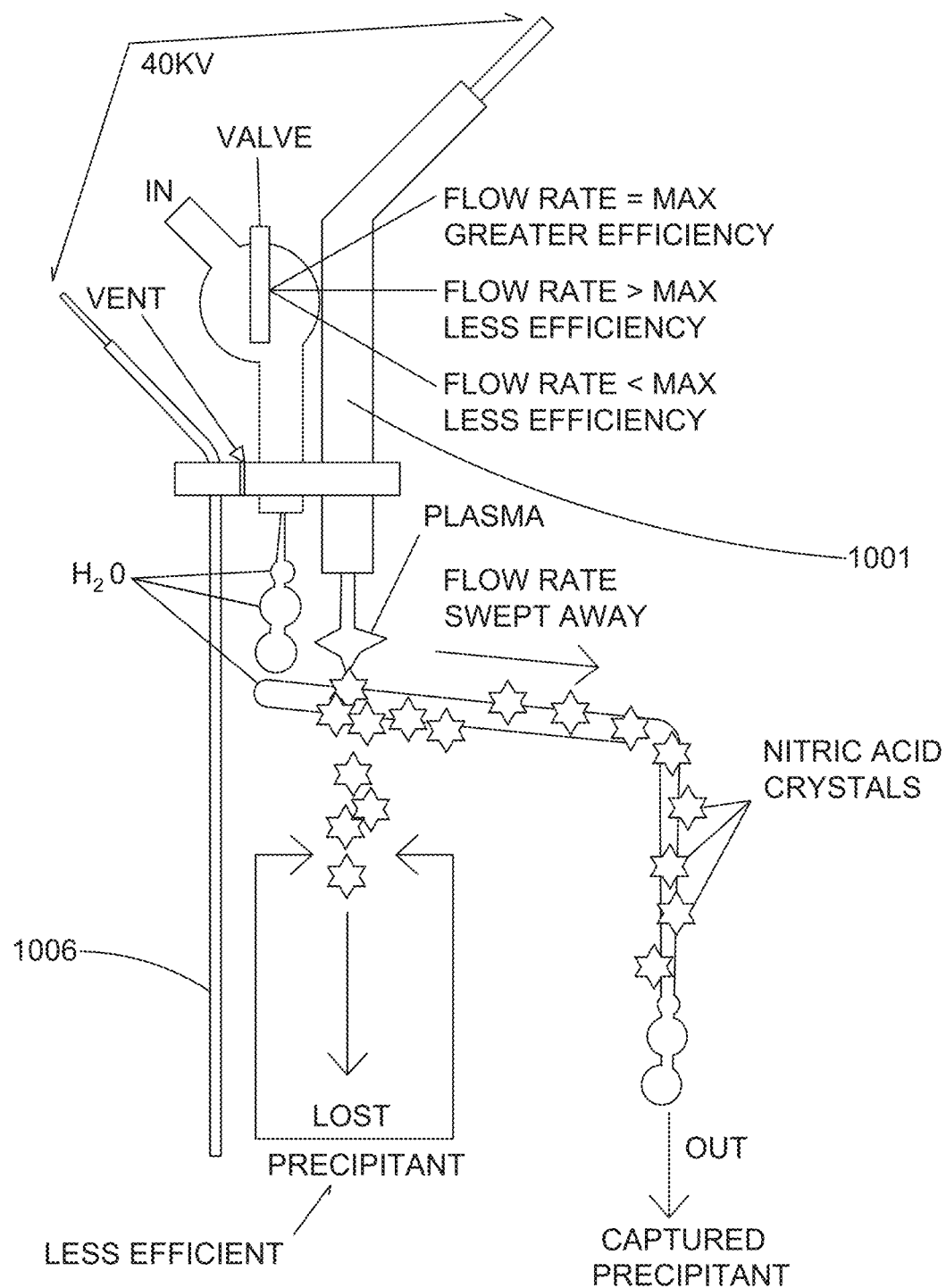
FIG. 11C is a schematic view of operational flow in a splitter reactor.

The reactor vessel 1310 comprises generally a closed chamber configured for receiving input gases, holding a collection liquid, and supporting various operational components. In the embodiment of FIG. 11B the reactor vessel 1310 includes an upper outer dome 1002 and a lower outer dome 1003, with the upper and lower domes 1002, 1003 forming a gas and liquid tight seal therebetween. While various configurations can be used, the two-part upper-lower dome 1002, 1003 configuration provides for ease of assembly as well as maintenance and repair of components.

A key feature of the reactor splitter 1000 is a two part electrode arrangement that creates a controlled but powerful plasma beam. The electrode arrangement creates a field of action 1004, which is indicated schematically by a rectangle in FIG. 11B, where molecules are split and recombined to produce nitric acid outputs. Due to the configuration of the reactor splitter 1000, this field of action reaches temperatures of about 35,000 degrees F. without compromising the components and operation of the reactor splitter 1000. As seen in FIG. 11B, the electrode arrangement includes a large electrode 1001 and a small electrode 1006. The electrodes 1001, 1006 may be stainless steel electrodes or may be formed of other metals or composites of various metals, depending on the desired operational characteristics.

In the embodiment of FIG. 11B, the large electrode 1001 is positioned on the upper end of the reactor splitter 1000 and protrudes through the top of the reactor vessel 1310. The large electrode 1001 is configured to create a powerful plasma beam. The large electrode 1001 is firing point blank from top of reactor down to the surface of the water. The large electrode 1001 creates a huge plume of plasma that has a temperature of about 35,000 degrees F. The large electrode 1001 is sized configured to withstand the rigors and temperatures encountered in producing a powerful plasma output.

A dielectric constant is used to create the plasma beam. The large electrode 1001 is enveloped in a large dielectric jacket 1011. The dielectric jacket 1011 is selected to provide high voltage insulation. The jacket 1011 can be silicon. The plasma beam emits from the lower end of the large electrode 1001, adjacent end of the dielectric jacket 1011.

The large electrode 1001 has a large mass in order to withstand the large amounts of energy and heat required to create the plasma beam. The diameter of the large electrode 1001 may be about one-quarter inch, or about 6 to 8 cm. The selection of materials governs the longevity of the device. For example, graphite could be used, but it would increase the cost. It is believed that readily available metals such as stainless steel, copper, aluminum and combinations of such metals can provide a duty cycle of about five years for the large electrode 1001.

The small electrode 1006 is mounted adjacent a bottom of the reactor. An antenna 1012 is attached to the small electrode 1006. As indicated in FIG. 11A, a tip of the antenna 1012 is preferably aligned below a plasma output end of the large electrode 1001. The tip of the antenna 1012 is also submerged below the surface of the water. The antenna 1007 can be a stainless steel tungsten wire, such as a 0.032 inch diameter stainless steel wire plasma antenna. A small SS machine threaded nut 1013 may be used to secure the small electrode 1006 and antenna 1012.

The small electrode 1006 and antenna 1012 serves as a guide for the plasma beam output of the large electrode 1001. The antenna 1012 acts like a plasma attractor. The antenna 1012 focuses the plasma into a beam rather than allowing the plasma to form a plasma cloud within the reactor, which greatly increases the efficiency of the reactor splitter 1000. The gap from the earlier embodiment has been replaced by the antenna 1012. Further this arrangement allows for arrangements and mechanisms for efficiently cooling the reactor splitter 1000 to prevent overheating.

A mechanism for temperature sensing and regulation is provided. In the depicted embodiment, the mechanism includes a temperature Probe 1009 is provided in communication with the interior of the reactor 1000. The temperature probe 1009 acts as a thermostat. The temperature probe 1009 communicates with an external temperature control circuit to temporarily turn off the large electrode 1001, thus providing a thermostatic fail-safe functionality.

Various gas and liquid input and output mechanisms are provided. One problem with the arrangement of the electrodes 1001, 1006 is that they create a large amount of heat. If the vessel is made of commonly available materials, such as CPV, it can withstand temperatures of about 250 degrees F., which is not sufficient to withstand melting. A cooling mechanism is therefore provided.

In the embodiment of FIG. 11, a dripping water mechanism is used to quench the flash of the ignition and cool the chamber. In the embodiment of FIG. 11B, an input drip emitter 1010 is mounted on or adjacent a top of the reactor 1000. The drip emitter 1010 is selected to produce a selected amount of output in a given period, such as 2 gallons per hour.

A drip guide 1007 may be provided below the input drip emitter 1010. The drip guide 1007 may be a jacket or sleeve that surrounds the output of the drip emitter 1010 and is positioned and configured to direct the flow of input water to a selected area of the water in the reactor 1000. As indicted in the schematic view of FIG. 11C, flow or drip of the input water stream is directed to a selected area of the water, which is typically located on the opposite side of the plasma beam from the output nozzle 1005, so as to create a steady flow of cool water through the area of the plasma beam. The drip guide 1007 may be made of a material that provides a durable useful life in the conditions encountered in the reactor during splitting. In some embodiments, the input drip guide 1007 may be a silicon jacket.

Water is provided to the input drip emitter 1010, such as via a pump. The input drip emitter 1010 controls the rate of flow. If the flow of new input water is shut off, the reactor quickly overheats. The flow of new input water cools the reactor and introduces new material into the reactor. As the water leaves the reactor vessel 1310 through the nozzle 1005, the water removes heat from the reactor splitter 1000. Cooling the input water before it enters the reactor 1000 can improve output of nitric acid by about 20 to 30 percent.

A gas input valve 1008 is provided on the reactor 1001, typically on or adjacent a top of the reactor vessel 1310. The gas input 1008 can be in the form of a "T." As described herein, the input gases can be ambient air or specialty gases. The input gases can be pumped through the gas input valve 1008 into the reactor vessel 1310. Additionally, the gas input valve 1008 can be configured to allow gases to escape the reactor vessel 1310 so as to prevent pressure build up and potential explosions, such as through an open end of the T-shape of the gas input 1008.

An output evacuation nozzle 1005 is provided on the reactor vessel 1310. The nozzle 1005 is left in an open position during production of nitric acid. An air vent 1014 is provided to assist with the flow of gas into the reactor vessel 1310. The air vent 1014 may be formed on the bend of the output evacuation nozzle 1005.

The output of nitric acid water is then swept or diverted into a collection vessel 1320. In the embodiment of FIG. 11A, the collection vessel 1320 is a L-shaped, but various configurations can be used, such as the tube or rail arrangement of FIG. 10. The collection vessel 1320 is provided with a means for selectively releasing fertilizer output 450, such as an output nozzle or spigot 1322. The collection vessel 1320 maybe provided with a mineral trap 1324, which may be internal to the vessel 1320 or in fluid communication with the vessel 1320. The mineral trap 1324 can take various forms, but essentially provides a place where raw material can be held or "trapped" for interaction with the nitric acid output of the reactor splitter 1000. The mineral trap 1324 is configured to hold raw material for conversion into fertilizer, such as the mineral and organic source materials discussed herein. In the mineral trap 1324, minerals are leached via the low pH of the output solution.

In the embodiment of FIG. 11A, the mineral trap 1324 is selectively attachable to the collection vessel 1320 via a treaded connection comprising a threaded connector 1320A of the collection vessel 1320 and a matching threaded connector 1324A of the mineral trap 1324.

Figure 11D:
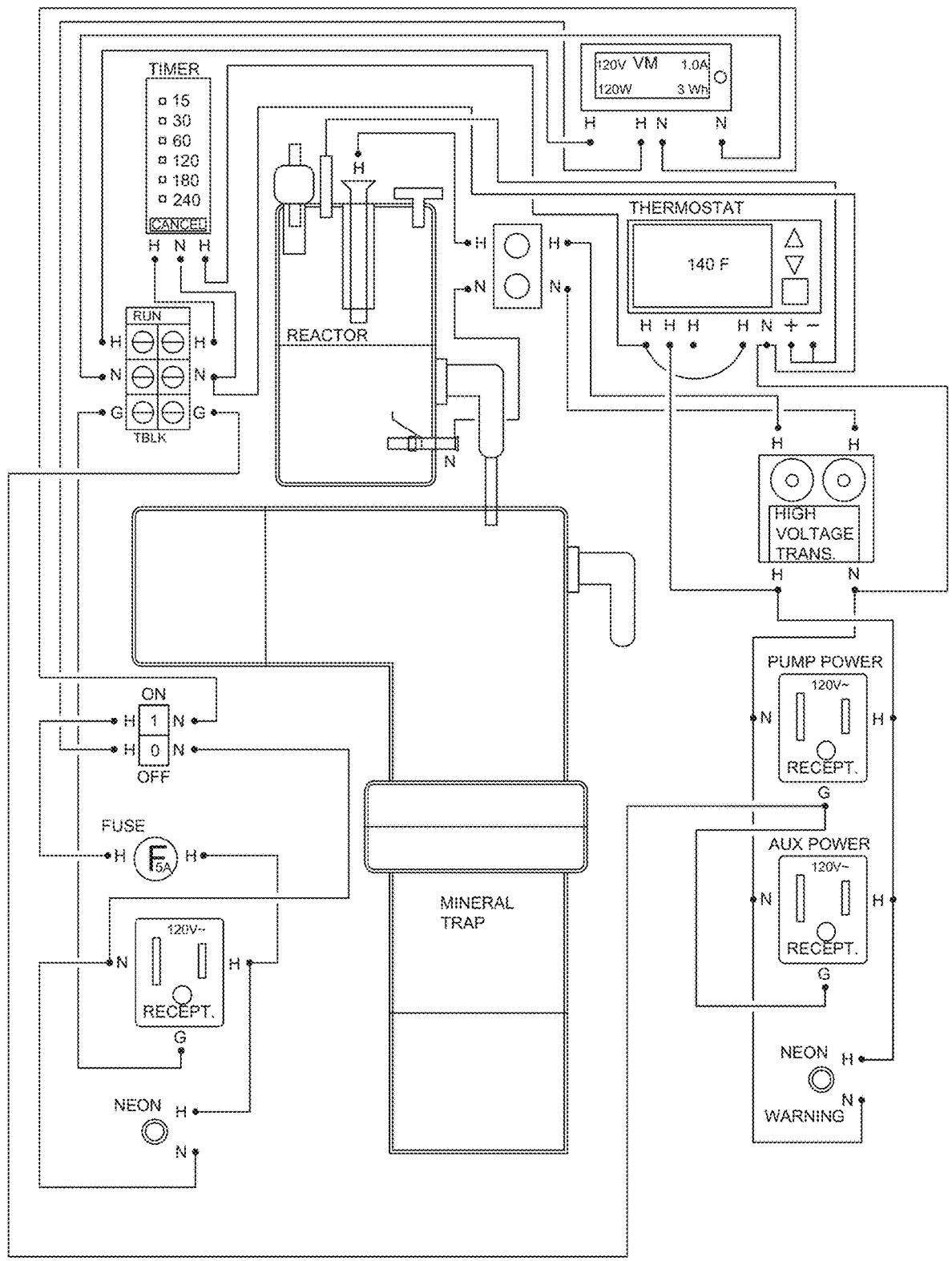
FIG. 11D is a cross-section view of one embodiment of circuitry for operation of a splitter reactor.

FIG. 11D shows a view of one embodiment of exemplary electrical circuity for use in operating a reactor splitter 1000.

Low Energy-Use Splitters

With reference to FIGS. 7A-7D, additional embodiments of splitters 100 will now be described. It should be appreciated that the described embodiments of splitters 100 solve a number of problems that the inventor encountered during the early development of splitter technology. Heat build-up was a particular problem. By solving the heat problem, the splitter became even more efficient and the device less complex. The embodiments described above were the most effective design for dissipating heat, so much so that applicant was able to eliminate outside cooling systems, such as fans. However, the following embodiments, which perform better with a cycled use of fans, largely overcame the overheating problems encountered with earlier embodiments.

In the splitter embodiment shown in FIG. 7, the splitter 100 includes, generally, a primary lengthwise sleeve or tube 110 having a gas input end 111 and a gas output end 112 disposed in a close fitting outer conductive sleeve or discharge tube 140. A lengthwise filament 130 is disposed within the primary tube 110.

A gas input sleeve 181 attaches an input end 111 of the primary sleeve to a gas sources such as a compressor.

In the embodiment of FIG. 7, the dielectric is a glass tube 110. The glass tube 110 may be glass (e.g. Pyrex™), ceramic, carbon, silicone, carbon fiber, mica or any material with the properties necessary for joining other components together as well as establishing an effective electrical and thermal barrier capable of withstanding continuous use. The tube 110 is wrapped in a conductive sleeve 140. The sleeve 140 can be a sheet of conductive foil 140. In one embodiment the tube is about 6 inches (15 cm) long and has an outer diameter of about 9 mm. The foil sleeve 140 preferably covers about two-thirds of the length of the tube 110, i.e. about 4 inches long for a 6 inch tube 110. The foil 140 is preferably provided in a very thin layer.

The center of the foil 140 and the center of the tube 110 are preferably aligned. A lead 14, such as an insulated wire, is affixed to approximately the center of the foil sleeve, such as with welded dot 151.

A filament 130 is inserted in the interior lengthwise opening 116 of the tube 110. The filament 130 is preferably made of a strong material that can be cut and compressed, such as tungsten, titanium, or steel. The material can be folded over on itself to create a filament 130 that fits within the interior bore 116 of the tube 110. The filament 130 extends from either end of the foil sleeve 140, preferably by about the length that the tube 110 extends beyond the foil 140.

A resistant wire 133 connects a distal end of the filament 130 to a discharge tube or conductive tube member 135. The discharge tube 135 has a lengthwise opening therethrough, to allow gas to pass through the discharge tube 135. The discharge tube 135 may be provided with a nipple 137 on the proximal end. The nipple 137 facilitates attachment of a distal end of the resistant wire 133 to the discharge tube 135, such as with a tack weld. The nipple 137 can be formed by making a cutout on the proximal end of the discharge tube 135. The discharge tube 135 is about 1 inch (2.5 cm) long in the depicted embodiment.

The electrode leads 13, 14 are connected to the conductor bands 149. The conductor bands 149 can be small bands of metal with a dot weld 151 on them. Each splitter 100 has two bands 149. The bands 149 are preferably about ⅜ inch wide. Various metals can be used for the conduction bands 149, such as copper. In one exemplary embodiment, the band 149 is about 60 percent silver and 40 percent lead.

The conductive bands 149 allow for neutral and hot connections. The neutral is put on the outer sleeve 140, which has more surface area. The splitter 100 has a hot, a neutral, and no ground. The conductive bands 149 serve as a deliverer of electrons and a potential difference. One band 149 is hot and the other band 149 is neutral.

The power supply can be AC or DC. If AC current is used, the current travels through a rectifier having four diodes, with positive on one side and negative on the other. The initial current is typically 120 Volts, such as from a conventional wall outlet. The current is directed into a step-up transformer, such as a round toroid transformer. The transformer steps up the voltage to over 5,000 volts. The splitter 100 creates a super high voltage AC current. The configuration of the sleeve is wrapped on one side of the ring and the other to create an oscillation. The apparatus sets up a neutral and a hot, which are alternating. The polarity does not appear to affect the results, but there is a benefit to placing on neutral. The current, which may be about 20 milliamps, alternates back and forth at super high frequency, such as 21,000 times per minute.

The splitter 100 facilitates the splitting of gases. It is believed that the super high frequency of the current helps the current bust through the dielectric of the sleeve 110. The dielectric must be able to resist penetration. MICA or silica can serve as the dielectric material. The super high frequency current energizes the outer conductor 140 that is over the dielectric sleeve 110, creating an energy potential on the outside of the dielectric material 110. In the embodiment of FIG. 7A, the dielectric is a glass tube 110. The glass tube 110 may be Pyrex™ glass. The tube 110 is wrapped in a conductive sleeve 140. The sleeve 140 can be a sheet of conductive foil 140. In one embodiment the tube is about 6 inches (15 cm) long and has an outer diameter of about 9 mm. The foil is preferably covers about two-thirds of the length of the tube 110, or is about 4 inches long. The foil 140 is preferably provided in a very thin layer.

The center of the foil 120 and the center of the tube 110 are preferably aligned. A dot 151 is placed at the center.

A filament 130 is inserted in the interior bore of the tube 110. The filament 130 is preferably made of a strong material that can be cut and compressed, such as tungsten, titanium, or steel. The material can be folded over on itself to create a filament 130 that fits within the interior bore of the tube 110. The filament 130 extends from either end of the foil 120, preferably by about the length that the tube 110 extends beyond the foil 120.

A resistant wire 133 connects a distal end of the filament 130 to a discharge tube 135. The discharge tube 135 may be provided with a nipple on the proximal end. The nipple facilitates attachment of a distal end of the resistant wire 133 to the discharge tube 140, such as with a tack weld. The nipple can be formed by making a cutout on the proximal end of the discharge tube 135. The discharge tube 135 is about 1 inch (2.5 cm) long in the depicted embodiment.

The electrodes 13, 14 are connected to the conductor bands 144. The conductors 144 can be little bands of metal (e.g. copper) with a dot 151, 152 on them. Each splitter 100 has two bands 144. The bands 144 are preferably about $3/8$ inch wide. Various metals can be used for the conduction bands 144. In an exemplary embodiment, the band 144 is about 60 percent silver and 40 percent lead.

The conductive bands 144 allow for neutral and hot connections. The neutral is put on the outer sleeve 140, which has more surface area. The splitter 110 has a hot, a neutral, and no ground. The conductive bands 144 serve as a deliverer of electrons and a potential difference.

Overheating is problem that had to be overcome through design iterations. The splitter 100 must be able to withstand high temperatures, high voltage, and low current. A silicon heat resistant tube 110 can withstand temperatures of about 500 degrees Fahrenheit. Silicon has a high dielectric, is flexible, and is heat resistant. Additionally, the tube 110 must be able to be made air tight and to withstand high pressures. In the depicted embodiment, the proximal or input end 111 of the silicon tube 110 couples to a Pyrex tube or sleeve 181. The distal or output end 112 of the silicon tube 110 can be coupled to the nipple of the discharge tube 135.

In the depicted embodiment of FIGS. 7A-7D, a compressor 40 is connected to a gas input tube. The gas input tube does not have to be as durable as the components of the splitter 100 and therefore can be made of various components. Conventional black silicon tubes can be used for the gas input tube. The gas input tube is in turn connected to the splitter input tube 181. The input tube 181 is preferably a strong but flexible material, such as silicon. The input tube 181 is connected to the input end 111 of the main tube 110. A second or output tube 182 is in turn connected the opposing output end 112 of the main tube 110. The discharge tube 135 may be housed within the output tube 182. The output tube 182 is in turn connected to a discharge tube, which can be of the same material as the gas input tube. A distal or output end of the discharge tube is disposed within a collection vessel, as described herein, for discharge and collection of nitrogen compounds. The discharge tube is preferably connected to a diffuser 200, as will be described below. The gas input and discharge tube are preferably sized to tightly (air tight) slip into the splitter input and output tubes 181, 182.

A rail 171, 172 provide both support and conductivity. The rails 171, 172 can be thought of as power rails or buses. The shielded conductive wire 13, 14 connects to each rail 171, 172. As indicated in FIG. 7D, a plurality of tubes can be arranged in parallel and powered and retained in position by common rails 171, 172.

The embodiment of FIG. 7A can run at 70 degrees F. Earlier embodiments would run at 150 to 160 degrees F. or more and required on-off cycles in order to avoid overheating.

Within the foil sleeve 140, the splitter 100 creates a vast energy field that is looking for somewhere to go. The foil 140 creates a magnetic field. The energy potential difference is created by the dielectric 110, which is parallel to the outer conductor 140 and the inner filament 130. Electricity will select the path of least resistance. Eventually, the strong electric field crosses the dielectric tube 110. The lower the voltage, the lower the chance of arcing; therefore, the voltage must be high. The arrangement of the elements of the splitter 100 creates a dispersal of energy into a soft coronal plasma discharge. The plasma discharge occurs within the gas field that has been pumped into the tube 110. Electric current travels through the tube 110 and into the internal conductor 130. There are no sparks. The current spreads out over the surface area of the conductive medium 140 and reaches the conductor 130 inside the dielectric tube 110.

The interior filament 130 should not be longer in length than the outer foil 140. The filament 130 is much more conductive than the resistant wire 135. This difference in conductivity between the filament 130 and the resistant wire 135 helps keep the electric field from creeping out of the system.

Earlier efforts to develop the invention used larger tubes. The inventor discovered that smaller diameter tubes and higher pressures provided better results. The gas is compressed and run through a small diameter. Less inner surface area leads to greater PSI. The interior space of the tube 110 is also limited by the filament 130 inside. The filament 130 fills up the interior bore of the tube 110. This configuration causes gas to accumulate in the tube 110, increasing the pressure. The gas spends more time in the electrical field. While in the electric field, the gas is bathed in a particular wavelength, such as 200-450 nanometers.

Refinements of the splitter have increased output while decreasing energy use. By using a small diameter tube with the right filament and the right frequency, the inventor dramatically increased the efficiency of the device. Additionally, the acid content of the output increased by 300-400%, which is desirable.

The electrical currents used in the splitters consist of high voltages, low currents, and high frequencies.

Theory and Characteristics of Operation

The splitter 100 functions as an atomizer. The splitter 100 causes gases to split and then allows them to recombine in random but opportunistic ways. Although the precise method of function is not known at the present time, it is believed that plasma dissociates gas molecules. The process may be similar to what happens when a lightning strike splits molecules into atoms.

It is believed that all or nearly all of the molecules in the field are split into individual atoms, or ions, while inside of the electric field. Each chemical bond is individually shaken apart. The splitter device splits apart atmospheric and terrestrial molecules into single atoms/charge ions so that they can be recombined or "fixed" into other compounds, such as nitrogen compounds. When the split or ionized atoms leave the electric field, they recombine based on proximity, charge and natural affinities. The resulting output differs considerably from the composition of molecules and atoms found in ambient air. The outputs are highly suited for use as fertilizer.

Compression is one of the keys to the function of splitters 100. A smaller diameter tube causes greater compression. The splitter 100 runs at a wavelength of about 200-400 nanometers, which is in the ultraviolet phase of the electromagnetic spectrum. During operation, a purplish light can be seen at the end of the tube, indicating the plasma state.

The UV light range is a safe range for human operation of the device 1. The process may be analogous to electrolytic splitting of water molecules. However, the splitter 100 performs electrolysis of gas.

The splitter 100 is unique in its efficiency at splitting gases. In particular, the device is configured to make it very efficient at splitting nitrogen.

The inventor shrunk the diameter of the splitter 100 down as part of the inventive process. This change was critical for increasing productivity. The reduction in diameter resulted in greater pressure in the tube, which increased the pressure on the gases in the tube. Shrinking down the size of the internal bore of the tube cut down the amount of energy needed to split molecular bonds. However, the diameter of the splitter 100 is relative to the desired scale. For example, the tube 110 and the internal filament 130 could be huge, so long as the overall configuration of the splitter 100 provides the operating characteristics described herein.

The configuration creates a back pressure, with essentially a large orifice on one side, and a small orifice on the other side. The internal pressure is high but not unreasonable and the splitter is configured to withstand the pressure. The resistant wire 130 is blocking flow and vibrating in the UV range. Gas is forced around the wire electrode 130. There are no air gaps and no waste. The molecules completely split and then reassemble into nitric acid.

The metals in the filament 130 can be braided together to form multiple wave lengths. For example, copper contributes red wavelength, stainless steel white-blue, and nickel ultraviolet. By combining different metals, different wavelengths can be obtained.

In alternative embodiments, the sleeve 140 can be split up into a plurality of smaller sleeves arranged along the tube 110. It is believed that this arrangement allows the gases to split apart and recombine and split and recombine in a series of stages. A braided electrode 130 along with a plurality of smaller sleeves allows for the creation of different nitrogen oxide reactant (NOR) products via different conditions (light frequency—temperature—recombining steps). The tubes are tuned based on selection of conductors, voltage, current, frequency, number of splits and recombining, PSI (pressure), Kelvin and the species of gases introduced into the invention. Selection of materials can control ppm of NOR as well as potency.

Compressor/Air Pump

The compressor 40 is conventional in form. The compressor forces gas into the input tube and into the splitter, as described herein. In some embodiments, the compressor 40 pulls in ambient air from the atmosphere and sends it to the splitter 100. In other embodiments, the compressor 40 receives selected gases from a commercial source, in which case the compressor can be in communication with a manifold. The compressor should have both input and output nozzles.

Output Collection

Various methods can be used to collect output from the splitter 100. Refinements in the collection of output have increased the efficiency of the apparatus 1.

One preferred method of collection involves running one output tube from one splitter 100 into a first beaker or other recipient container containing a large volume of water, and running a second splitter 100 into a second beaker or other recipient container containing a small volume of water. $NH_3+$ and $NH_4+$ tend to collect in the larger container. When the output from one splitter 100 is discharged into a small volume of water, the pH in the collection vessel can be pulled to about 1.5 to 1.6 within minutes. Further output from the splitter 100 can result in a pH under 1.0 in the collection vessel. The output from the splitter into the low-volume vessel is so acidic that it can melt rock. The resulting acid-base interaction produces a colloidal suspension or an acid emulsion.

The smaller second collection vessel can be considered a staging vessel. Minerals can be selectively introduced into the staging vessel, where they react with the acidic (e.g. pH 1.5) output from the splitter 100. Mineral dissolution of elementals salts occurs in the water in the collection vessle, with salts dissolved and well-suspended in the output medium in the second receptacle 322.

Diffuser

Earlier embodiments of the invention used a diffuser. A diffuser can be a multi-pore attachment to the end of the discharge tube. The diffuser allows the reassembled atoms to be captured and trapped in the two output vessels. The low energy, low heat splitter described above does not require a diffuser. However, in some embodiments, performance of the device 1 can be further improved by using a diffuser, which facilitates more efficient collection of output gases in the collection receptacle.

In some embodiments, each discharge tube preferably has a diffuser on an end thereof. The diffuser is placed in the liquid in the collection vessels. The diffuser washes or scrubs valuable NOR products out of the existing gas stream and into the collection medium. Any device that disperses gas, such as an air stone, can be used as a diffuser. In some cases, the use of a diffuser enhances the trapping ability of the liquid by about 47%. The diffuser increases the yield, perhaps by aiding emulsification of outputs in the liquid in the collection vessel.

Mixer Apparatus

A mixing means, such as a magnetic propeller or other spinner apparatus, can be used to stir water 305 in the collection vessel 302. The spinner can be driven by a spinning metallic or magnetic underplate. pH drops significantly with spin. Movement of the liquid along with inertia of liquid against the walls of the vessels, enhances the dissolution of minerals and non-minerals into the liquid. While the spinner is primarily used in the larger vessel, but it can be used in the smaller collection vessel as well.

Additives

As has been noted, a key feature of the apparatus 1 of the invention is that ambient air can be used to create prodigious amounts of fixed nitrogen. Additionally, various minerals can be added to the collection vessel in order to enhance output for use as fertilizer. Ideal minerals, in their simplest form, consist of thirteen elemental essential plant nutrients contained in specific types of rock dusts. These nutrients maybe introduced into the system as any combination of dust, including but not limited to the following: Phosphates (P), Potassium (K), Calcium (C), Magnesium (Mg), Sulfur (S), Iron (Fe), Boron (B), Manganese (Mn), Molybdenum (Ml), Zinc (Zn), Copper (Cu), Nickel (Ni) and Chlorine (Cl). Alternatively, an ore can be introduced, such as soft rock phosphate, magnesium sulfate, or azomite. The ores are preferably pulverized prior to introduction into the vessel.

Essential plant minerals contained in the rock dusts are dissolved into emulsion via the extremely low pH environment that the system maintains as a consequence of the splitter 100 operation as it generates nitric acid, $HNO_3$. Elemental salt ions liberated from rock dust bond with nitrogen compounds, creating longer complex molecules that enhance nutrient quality. A wide variety of nutrient molecules are created, allowing the system to produce a myriad of high quality plant foods.

Alternatively or in addition to minerals, organic materials can be introduced into the vessel, such as plants or animals. Plants can be provided in the form of leaves, stalks, compost, or other forms of complex plant materials. Animal material will typically in the form of waste products, such as chicken, cow, or pig manure. However, byproducts of animal processing can be used, such as waste hides, bones, carcasses, entrails and the like.

Earlier Embodiments of Output Collection

In some embodiments of the invention, the collection is envisioned as a "trap." This trap concept may be useful in certain applications of the technology. The trap is used for the purpose of trapping and absorbing nitrogen compounds into any suitable emulsion that can be used as a storage and transport medium. A trap in its simplest form consists of three components: (1) A watertight emulsion chamber capable of being pressurized with two nozzles so that one nozzle is for input gases and the other or second nozzle is for output gases; (2) a hydrogen oxygen (H—O) generator that is retrofitted within the pressurized watertight chamber to both generate and mix hydrogen and oxygen into the emulsion chamber; (3) a transducer fogger that is retrofitted within the pressurized watertight chamber within and above the emulsion for the purpose of atomizing the emulsion into even sized nanoparticles.

The trap was considered to be a necessary component of early embodiments of the invention. However, as described above, improvements to the invention have made a trap optional.

Heat Reduction

If the tubes get too hot, output is less efficient. In early embodiments, a "flip-flop" method was developed to prevent overheating. This involved a circuit that alternatively shut off power to splitters 100, such that one splitter cooled while the other continued to operate. The time of the run can be pre-set to prevent over-production or over-heating. If a fan stops working, the system can be configured to automatically shut down to prevent overheating. Fans can be provided to keep the device cool. However, recent iterations have made fans less and less important, since heat generation is minimized. However, the preferred embodiments described herein have overcome the problem of overheating.

Manifold

Figure 9:
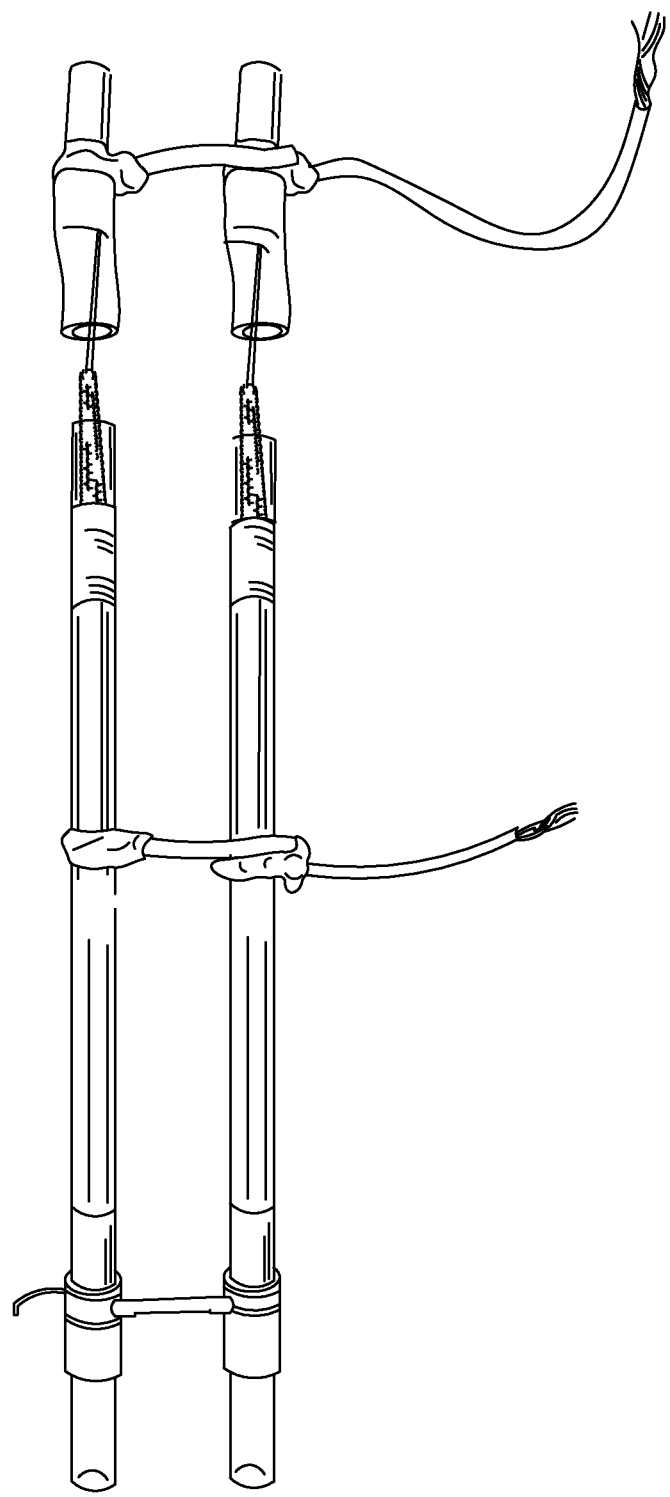
FIG. 9 is a side exploded view of a splitter embodiment of FIG. 7.

As those shown in FIGS. 9 and 10, a manifold can be used to introduce commercial sources of compressed air into the splitter 100. Increases in efficiency of the device, and particularly the splitter 100, make it possible to use ambient air rather than compressed air and thereby optionally eliminate the manifold. Nonetheless, a manifold may be used, and will particularly useful when introducing selected gases from multiple commercial sources, such as canisters of compressed oxygen, nitrogen, nitrous oxide, etc.

The manifold in its simplest embodiment consists of a manifold body comprising an airtight cavity directly interfaced with the compressor 40, and one or more input devices or nipples that are placed into the manifold in order to deliver atmospheric or terrestrial gases into the compressor. Essentially the manifold is used to control the input of atmospheric, terrestrial and synthetically concentrated gases directly into the apparatus 1. The manifold can be tuned via input nipples and can be either be fully open, fully closed or adjusted somewhere in-between being fully open or closed. The gases introduced into the device 1 may be directed back into the manifold or discharged through a special catalyst referred to as a destruct device and then back into the environment.

Oxone Production

Figure 4:
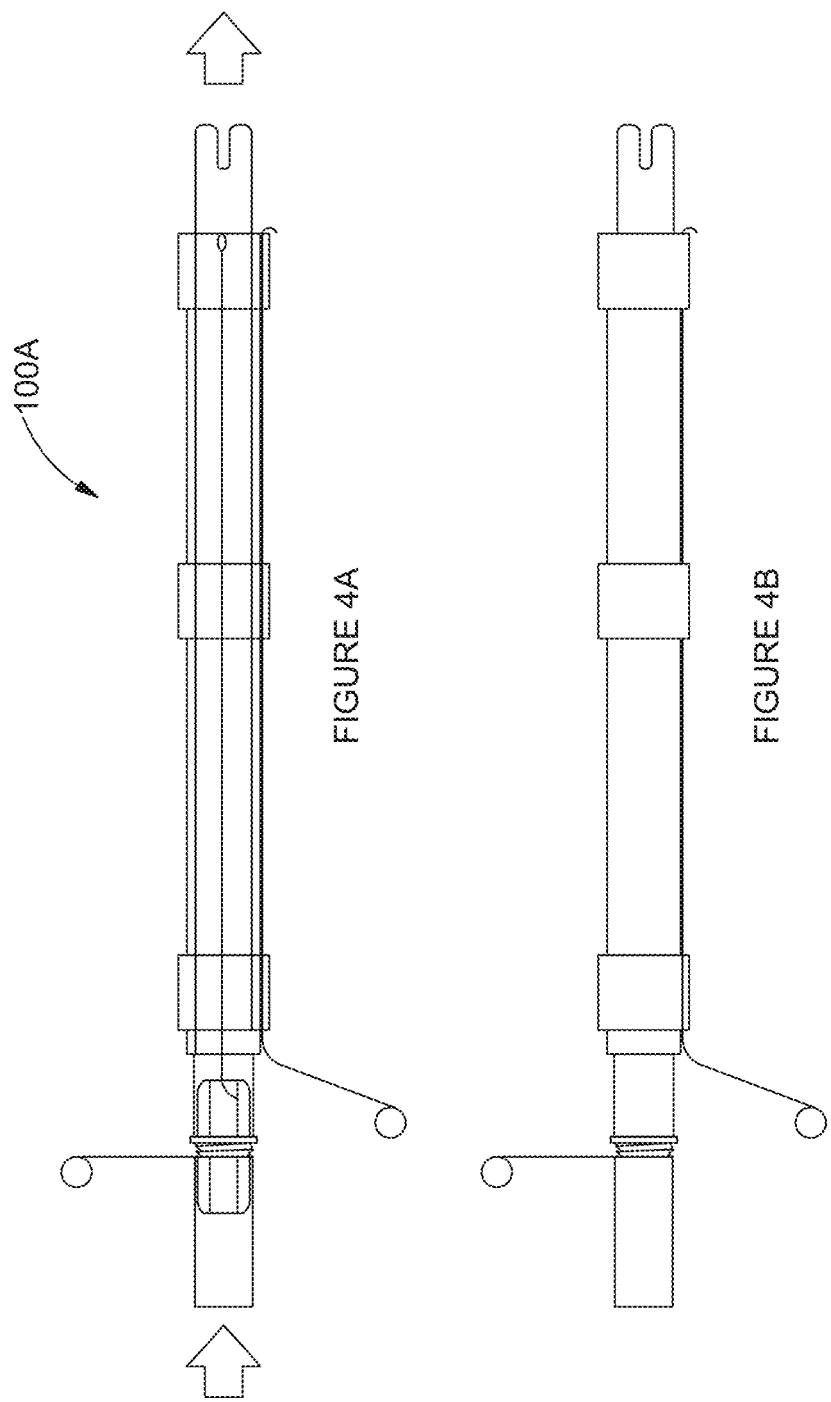
FIG. 4A is a side interior view of a splitter configured for producing ozone.
FIG. 4B is a side exterior view of a splitter configured for producing ozone.
Figure 5:
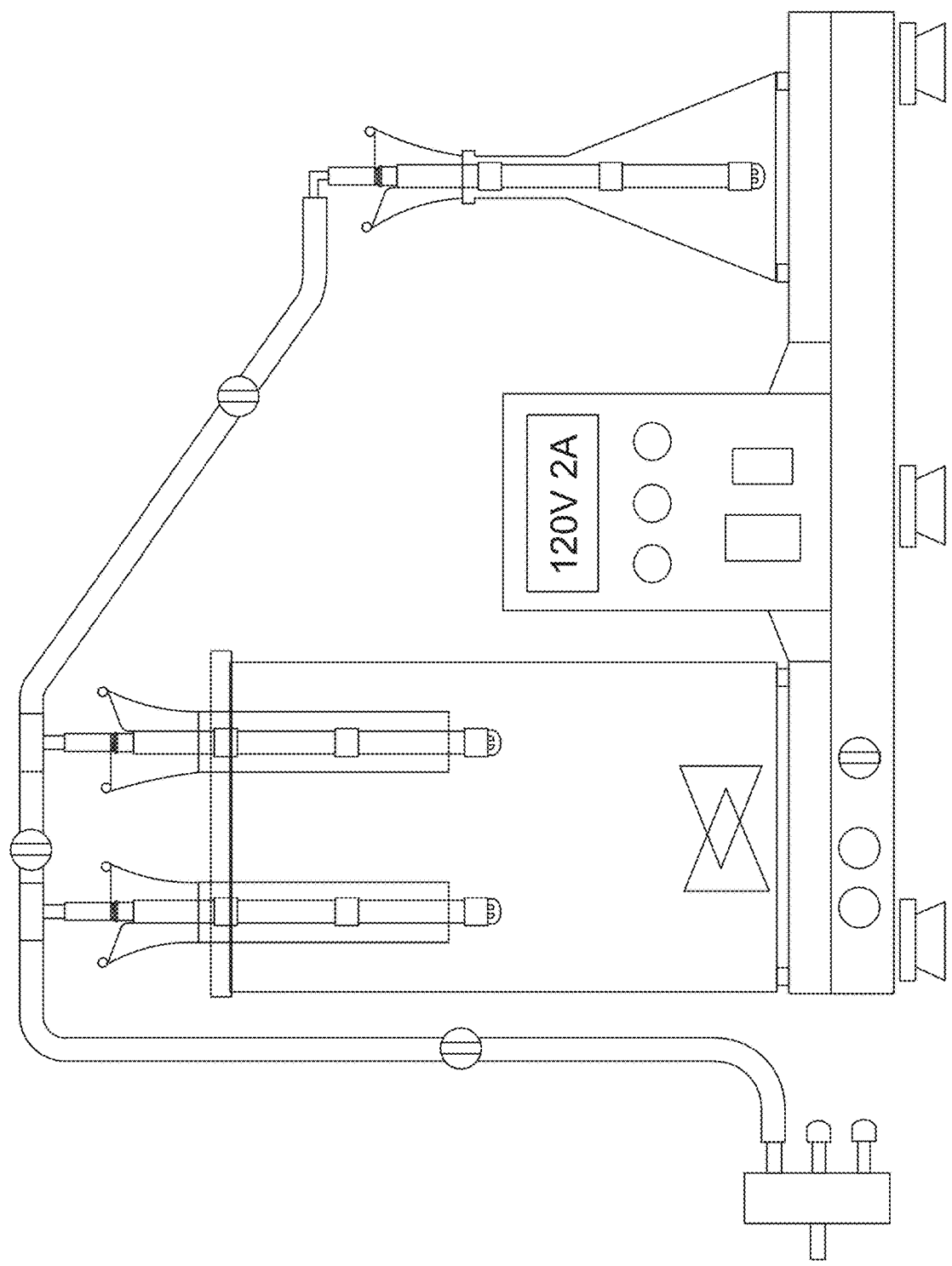
FIG. 5 is a splitter arrangement having two splitters in a primary collection vessel and one splitter in a concentrated collection vessel.

As shown in FIGS. 4A-4B, the components of the invention 1 can be configured to produce a splitter 100 for producing ozone ($O_3$). This device efficiently splits molecular oxygen ($O_2$) into oxygen ions, which then recombine to produce ozone. As indicated in FIG. 5, the ozone is collected in a collection vessel in a manner similar to operation of the nitrogen splitter. FIG. 6 provides an example of a circuit arrangement for operating an ozone splitter.

Methods of Use

Experimental tests verify that the device 1 can make fertilizer out of air in one minute using low levels of energy. These efficiencies open up wide areas of use for the device.

Places where the invention may find use include major agriculture (bulk production of fertilizer), small agriculture (production of a fertilizer at individual farms or in green houses), retail stores (such as nurseries and home and garden stores), preppers, specialized agriculture (e.g. marijuana growing), and outer space (spaceships, space stations, colonization of planets).

The device can be powered by the PTO of a tractor. This arrangement allows the device to be powered in a remote location, such as in a field.

The device can be operatively attached to irrigation equipment, such that fertilizer is created on-site, even in real-time, and sprayed onto fields using the irrigation equipment. Alternatively, the device can be provided on a tractor or on a trailer attached to a tractor, and used to produce fertilizer on site, in real-time, for spraying as the tractor navigates a field.

A water tank can be fitted with the device in fields, with associated solar panels for power. The device can produce fertilizer in the tank. On an as needed basis, a farmer can transport fertilizer water from the tank to nearby fields. Such practices reduce or eliminate the need to obtain fertilizer from an off-site source.

The device can be powered with a bigger power supply for industrial production. The principles will be same, but longer and wider splitters can be used.

Alternatively, the device can be made small, for use in home gardens, green houses, nurseries, and the like. Smaller embodiments can be provided in a carrying case to protect the components of the device during transport.

One of the big costs in conventional fertilizer production is acid. With the invention 1, the need for acid is eliminated, and energy becomes the biggest cost. However, the invention 1 can produce large amounts of fertilizer with little energy.

The technology of the invention will find uses in space travel. It can be used to create fertilizer from raw materials on a spaceship. It can also be used to create fertilizer on planets, such as by melting Martian rock.

The invention allows plant material to be turned into fertilizer within minutes. Waste vegetables or other plant material can be disposed of simply by placing the materials into the second (hammer) reception vessel, where they will be rapidly oxidized and converted into fertilizer. Materials such as crushed rock, leaves, ashes, wood ash, urine and manure can be used. The materials can be melted to a desired pH and then used as fertilizer.

Through the use of the invention, it is no longer necessary to add artificial acids to plant food. Essential elements such as oxides, potasssim, phosphate, calcium, sulfer, magnesium, boron, iron, malidinum, manganese, zinc, nickel, copper, chlorine can be obtained simply from waste plant material. When broken down in the hammer, an ideal fertilizer is obtained.

The invention reduces pollution, such as by converting waste into fertilizer. It reduces the amount of energy required to fix nitrogen. All of these features are better for the environment.

Various other uses of the device can be contemplated. Some of these are by products of the splitting process, but nonetheless can be harnessed for important uses.

The device 1 efficiently purifies water. Various uses of this aspect of the invention can be envisioned. In rural villages, potable water can be produced by attaching the device to a power source, such as solar panels, such that potable water can be continuously produced. Campers can use the device to purify water while camping. Contaminated water can be easily purified by dropping the pH to the point where bacteria and other organics break down.

Miniature splitters can be put into oxygen concentrators, where they can be used to process pure oxygen to make atomic oxygen, which can be used to purify or oxidize metals.

One of the results of the invention 1 is breakdown of carbon dioxide ($CO_2$). Ambient air contains trace amounts of $CO_2$. As is well known, use of fossil fuels as an energy source releases large quantities of $CO_2$ into the atmosphere, where it is theorized to contribute to climate change. It is known that artificial splitting of atmospheric $CO_2$ will reduce the amount of $CO_2$ in the atmosphere. However, the problem with artificial splitting of $CO_2$ is that the process requires a large energy input, and the goal of breaking down excess $CO_2$ is thwarted if fossil fuel is used as the energy source. With the device of the invention, it is possible to use non-carbon based energy sources, such as solar, wind, and nuclear energy, to efficiently breakdown $CO_2$. As such, the invention can serve as an atmospheric $CO_2$ reduction device. This could take the form of an individual attaching the device to a solar panel and letting it run on their rooftop. Or it could take the form a $CO_2$ reduction farm in which large scale versions of the device operate under the power of solar, wind or other non-fossil fuel forms of power.

Alternatively, the device can be connected directly to the exhaust of a thermal combustion engine in order to immediately breakdown and fix $CO_2$ into more complex carbon compounds. Such arrangements would have the advantage of immediately treating exhaust prior to reentry into the atmosphere, thus reducing the output of $CO_2$ from conventional sources such as cars, airplanes, and generators. Further research and development may be necessary in order to maximize such applications of the invention 1.

Although the present invention has been described in terms of specific embodiments, it is anticipated that alterations and modifications thereof will no doubt become apparent to those skilled in the art. It is therefore intended that the following claims be interpreted as covering all alterations and modifications that fall within the true spirit and scope of the invention.

What is claimed is:

1. A system for producing fertilizer comprising:
a reactor vessel comprising a closed chamber, the reactor vessel comprising an upper outer dome and a lower outer dome, with the upper and lower domes forming a gas and liquid tight seal therebetween,
the closed chamber housing:
a collection liquid comprising water, the water having a water surface,
a reactor splitter configured to create a plasma output via electricity, the plasma output configured to split nitrogen, the reactor splitter having a two part electrode arrangement comprising
a large electrode positioned on an upper end of the reactor splitter and protruding through a top of the reactor vessel, the large electrode firing the plasma output onto the water surface,
a small electrode mounted adjacent a bottom of the reactor, the small electrode having an antenna, a tip of the antenna aligned below the plasma output of the large electrode, the small electrode and the antenna submerged below the water surface, the antenna focusing the plasma output into a plasma beam in the collection liquid to thereby increase efficiency of the reactor splitter,
wherein the large electrode has a diameter of about one-quarter inch, the large electrode being larger than the small electrode such that the large electrode is sized to withstand the amount of energy and heat required to generate the plasma output,
an output evacuation nozzle for evacuating collection liquid from the reactor vessel to a collection vessel,
a gas input configured to deliver nitrogen to the reactor vessel,
a collection vessel, the collection vessel positioned to collect collection liquid containing split nitrogen from the reactor vessel for recombination of split nitrogen into an aqueous nitric acid solution, and
a cooling arrangement for preventing the reactor splitter from overheating, wherein the cooling arrangement comprises the water in the reactor vessel and an input drip emitter in the reactor vessel for selectively introducing a flow of water into the reactor vessel, and removal of collection liquid to the collection vessel via the output evacuation nozzle.

2. The system of claim 1, wherein the system is powered by conventional AC current.

3. The system of claim 1, further comprising a solar panel providing the system with electricity.

4. A method of manufacturing fertilizer comprising:
providing a reactor vessel and collection vessel according to claim 1,
powering the reactor splitter via electricity to create the plasma output,
cooling the splitter during plasma output via the cooling arrangement to prevent over-heating,
providing a supply of gas containing nitrogen to the plasma output to thereby create split nitrogen,
collecting the split nitrogen in the water of the reactor vessel to form the collection liquid,
evacuating collection liquid containing split nitrogen to the collection vessel,
allowing the split nitrogen to recombine into nitric acid in the water in the collection vessel to form an aqueous nitric acid output, and
transferring the aqueous nitric acid to a secondary collection vessel for use as fertilizer.

5. The method of claim 4, wherein the gas comprises ambient air.

6. The method of claim 4, wherein the gas is from a compressed source.

7. The method of claim 4, wherein the aqueous nitric acid output has a pH of between about 1.5 and about 1.0.

8. The method of claim 7, further comprising introducing a source material into the aqueous nitric acid and allowing the aqueous nitric acid to breakdown the source material to produce a complex fertilizer end product.

9. The method of claim 7, wherein the source material comprises a mineral.

10. The method of claim 7, wherein the source material comprises an organic material.

11. The system of claim 1, further comprising a temperature probe in the reactor vessel communicating with an external temperature control circuit to temporarily turn off the large electrode in the event of overheating in the reactor vessel.

12. The system of claim 11, wherein the reactor vessel comprises PVC.

13. The method of claim 4, further comprising a temperature probe in the reactor vessel communicating with an external temperature control circuit to temporarily turn off the large electrode in the event of overheating in the reactor vessel.

14. The method of claim 13, wherein the reactor vessel comprises PVC.

15. The method of claim 4, wherein the aqueous nitric acid output has a pH of between about 1.5 to 1.6.

\* \* \* \* \*